US007649227B2

(12) United States Patent
Yamazaki et al.

(10) Patent No.: US 7,649,227 B2
(45) Date of Patent: *Jan. 19, 2010

(54) SEMICONDUCTOR DEVICE AND METHOD OF FORMING THE SAME

(75) Inventors: Shunpei Yamazaki, Setagaya-ku (JP); Yasuhiko Takemura, Atsugi (JP); Hongyong Zhang, Yamato (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 252 days.

This patent is subject to a terminal disclaimer.

(21) Appl. No.: 11/594,759

(22) Filed: Nov. 9, 2006

(65) Prior Publication Data

US 2007/0096210 A1 May 3, 2007

Related U.S. Application Data

(62) Division of application No. 10/805,327, filed on Mar. 22, 2004, now Pat. No. 7,148,542, which is a division of application No. 09/225,559, filed on Jan. 5, 1999, now Pat. No. 6,709,907, which is a division of application No. 08/019,880, filed on Feb. 19, 1993, now Pat. No. 5,894,151.

(30) Foreign Application Priority Data

| Feb. 25, 1992 | (JP) | ................................... 4-073313 |
| Feb. 25, 1992 | (JP) | ................................... 4-073315 |
| Mar. 13, 1992 | (JP) | ................................... 4-089992 |

(51) Int. Cl.
*H01L 27/01* (2006.01)

(52) U.S. Cl. ........................... 257/347; 257/349

(58) Field of Classification Search ............... 257/57, 257/59, 66, 607, 616, 55, 63, 67, 77, 270, 257/347, 349, 352, 285, 286, 344, 346, 412, 257/51, 52, E27.131, E29.117, E27.112, 257/E21.192; 438/585
See application file for complete search history.

(56) References Cited

U.S. PATENT DOCUMENTS 4,357,179 A 11/1982 Adams et al.

(Continued)

FOREIGN PATENT DOCUMENTS

JP 53-003075 1/1978

(Continued)

OTHER PUBLICATIONS

Matsuda, A., et al., "Structural Study on Amorphous-Microcrystalline Mixed-Phase Si:H Films," JJAP, vol. 20, No. 6, Jun. 1981, pp. L439-L442.

(Continued)

*Primary Examiner*—Roy K Potter
(74) *Attorney, Agent, or Firm*—Eric J. Robinson; Robinson Intellectual Property Law Office, P.C.

(57) ABSTRACT

An insulated gate semiconductor device comprising an insulator substrate having provided thereon a source and a drain region; a channel region being incorporated between said source and said drain regions, said channel region comprising a polycrystalline, a single crystal, or a semi-amorphous semiconductor material; and a region provided under said channel region, said region comprising an amorphous material containing the same material as that of the channel region as the principal component, or said region comprising a material having a band gap larger than said channel region.

A process for fabricating the device is also disclosed.

26 Claims, 10 Drawing Sheets

U.S. PATENT DOCUMENTS

| | | | |
|---|---|---|---|
| 4,409,134 A | 10/1983 | Yamazaki | |
| 4,727,044 A | 2/1988 | Yamazaki | |
| 4,757,028 A | 7/1988 | Kondoh et al. | |
| 4,762,806 A | 8/1988 | Suzuki et al. | |
| 4,762,807 A | 8/1988 | Yamazaki | |
| 4,775,641 A | 10/1988 | Duffy et al. | |
| 4,814,292 A | 3/1989 | Sasaki et al. | |
| 4,816,893 A | 3/1989 | Mayer et al. | |
| 4,851,363 A | 7/1989 | Troxell et al. | |
| 4,916,090 A | 4/1990 | Motai et al. | |
| 4,933,298 A | 6/1990 | Hasegawa | |
| 4,960,719 A | 10/1990 | Tanaka et al. | |
| 5,053,354 A | 10/1991 | Tanaka et al. | |
| 5,111,261 A | 5/1992 | Tanaka et al. | |
| 5,124,768 A | 6/1992 | Mano et al. | |
| 5,248,630 A | 9/1993 | Serikawa et al. | |
| 5,254,208 A | 10/1993 | Zhang | |
| 5,272,361 A | 12/1993 | Yamazaki | |
| 5,275,872 A | 1/1994 | Chang | |
| 5,289,030 A | 2/1994 | Yamazaki et al. | |
| 5,294,555 A | 3/1994 | Mano et al. | |
| 5,294,811 A | 3/1994 | Aoyama et al. | |
| 5,313,076 A | 5/1994 | Yamazaki et al. | |
| 5,313,077 A | 5/1994 | Yamazaki | |
| 5,315,132 A | 5/1994 | Yamazaki | |
| 5,365,080 A | 11/1994 | Yamazaki et al. | |
| 5,424,230 A | 6/1995 | Wakai | |
| 5,473,168 A | 12/1995 | Kawai et al. | |
| 5,481,121 A * | 1/1996 | Zhang et al. | 257/64 |
| 5,485,019 A | 1/1996 | Yamazaki et al. | |
| 5,514,879 A | 5/1996 | Yamazaki | |
| 5,530,265 A * | 6/1996 | Takemura | 257/66 |
| 5,543,636 A | 8/1996 | Yamazaki | |
| 5,554,861 A | 9/1996 | Mano et al. | |
| 5,591,987 A | 1/1997 | Yamazaki et al. | |
| 5,753,542 A | 5/1998 | Yamazaki et al. | |
| 5,808,321 A * | 9/1998 | Mitanaga et al. | 257/72 |
| 5,894,151 A * | 4/1999 | Yamazaki et al. | 257/347 |
| 6,376,860 B1 * | 4/2002 | Mitanaga et al. | 257/57 |

FOREIGN PATENT DOCUMENTS

| | | |
|---|---|---|
| JP | 55-011329 | 1/1980 |
| JP | 57-099778 | 6/1982 |
| JP | 58-118154 | 7/1983 |
| JP | 58-206121 | 12/1983 |
| JP | 58-206163 | 12/1983 |
| JP | 59-033877 | 2/1984 |
| JP | 59-159544 | 9/1984 |
| JP | 60-098680 | 6/1985 |
| JP | 60-109282 | 6/1985 |
| JP | 60-113971 | 6/1985 |
| JP | 60-245172 | 12/1985 |
| JP | 61-087371 | 5/1986 |
| JP | 61-187274 | 8/1986 |
| JP | 61-263273 | 11/1986 |
| JP | 62-269358 | 11/1987 |
| JP | 62-282464 | 12/1987 |
| JP | 02-001174 | 1/1990 |
| JP | 02-103925 | 4/1990 |
| JP | 02-130912 | 5/1990 |
| JP | 02-207537 | 8/1990 |
| JP | 03-154383 | 7/1991 |
| JP | 03-265142 | 11/1991 |
| JP | 04-088642 | 3/1992 |
| JP | 04-267563 | 9/1992 |
| JP | 05121440 | 5/1993 |

OTHER PUBLICATIONS

Matsuda, A., et al., "Electrical and Structural Properties of Phosphorous-Doped Glow-Discharge Si:F:H and Si:Fi Films," JJAP, vol. 19, No. 6, Jun. 1980, pp. L305-L308.

USUI, S., et al., "Properties of Heavily Doped GD-Si With Low Resistivity," Journal of Non-Crystalline Solids 34, 1979, pp. 1-11.

Hirose, M. et al., Electronic Density of States in Discharge-Produced Amorphous Silicon, Appl. Physc. Lett., vol. 34, No. 3, Feb. 1, 1979, pp. 234-236.

Hirose, M., et al., "Determination of Localized State Density Distribution in Glow Discharge Amorphous Silicon," Proceedings of the 10th Conference on Solid State Devices, Tokyo, 1978, Japanese Journal of Applied Physics, vol. 18, (1979), Supplement 18-1, pp. 109-113.

* cited by examiner

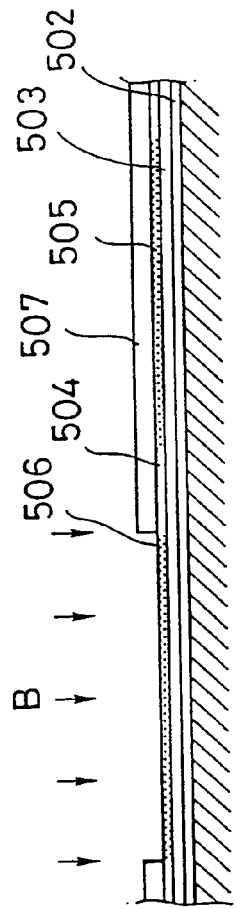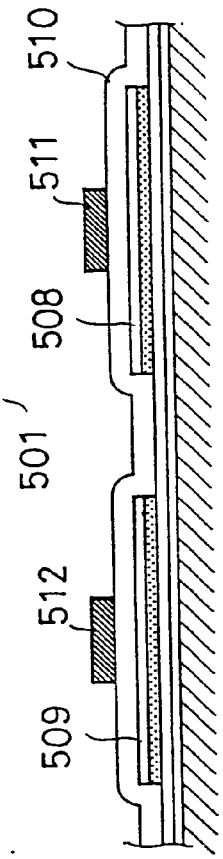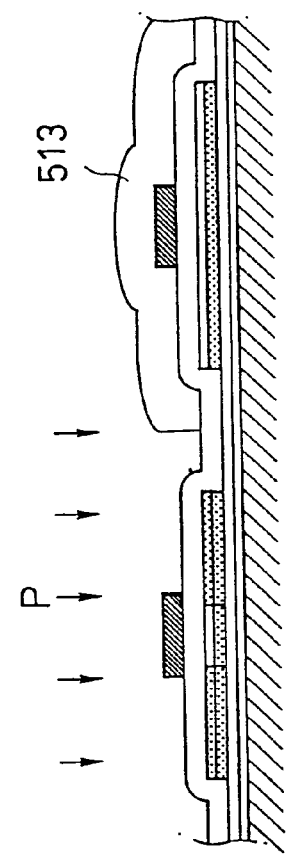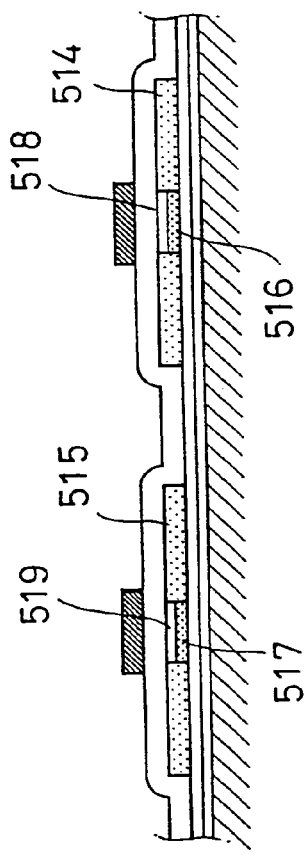
FIG. 8(A)
FIG. 8(B)
FIG. 8(C)
FIG. 8(D)

SEMICONDUCTOR DEVICE AND METHOD OF FORMING THE SAME

BACKGROUND OF THE INVENTION

1. Field of the Invention

The present invention provides a thin film insulated gate semiconductor device, and more specifically, it relates to a thin film transistor (TFT) having a large ON current to OFF current ratio (ON/OFF ratio) with particularly low OFF current.

2. Description of the Prior Art

Recently, researches are made on insulated-gate type semiconductor devices having a thin film channel on an insulator substrate. In particular, an extensive study is made on thin film insulated gate transistors, i.e., on so-called thin film transistors (TFTs). Those TFTs are intended for controlling pixels of matrix-structured display devices such as those equipped with liquid crystals. The TFTs are classified according to the type of semiconductor which is used therein. For example, they include amorphous silicon TFTs and polycrystalline silicon TFTs. Particularly at present, more effort is paid on the study of materials which take an intermediate crystal structure between amorphous and polycrystalline. Such materials, which are called semi-amorphous silicon, are believed to comprise small crystals being suspended in an amorphous texture.

In an integrated circuit (IC) based on single crystal silicon, polycrystalline silicon TFT also is employed in the so-called SOI technology, for example, to use as a load transistor in a highly integrated SRAM. In this case, however, an amorphous silicon TFT is very rarely used.

Amorphous silicon in general cannot be applied to rapid TFTs because the electric field mobility thereof is low. In particular, a p-channel TFT (PTFT) is unfeasible because the p-type electric field mobility is extremely low. Accordingly, no complementary MOS (CMOS) circuits can be realized using an amorphous silicon because the PTFT cannot be used in combination with an n-channel TFT (NTFT).

However, because the OFF current of an amorphous semiconductor TFT is small, those TFTs based on amorphous silicon are made the best of in applications such as transistors for active matrices of liquid crystals. In such applications, no rapid operation is required, and a TFT having either of the conductivity types suffices the demand. As the requirement for the TFT for such applications being high charge retention capacity, the above mentioned amorphous semiconductor TFTs are favorably employed.

In the contrary to the amorphous semiconductors, polycrystalline semiconductors have larger field mobility and hence are capable of rapid operation. In a TFT employing a silicon film recrystallized by laser annealing, a field mobility as high as 300 cm$^2$/Vs is obtained. It can be seen that the value above for the recrystallized polycrystalline silicon film is extremely high as compared with that of a MOS transistor having fabricated on an ordinary single crystal silicon substrate, which is about 500 cm$^2$/Vs. Considering that the operation speed of a MOS circuit being fabricated on a single crystal silicon is considerably impaired by the stray capacitance between the substrate and the connections, an extremely high operation speed is expected for the device on polycrystalline silicon because an insulator substrate is used therein.

Furthermore, not only an NTFT but also PTFT can be fabricated using polycrystalline silicon. Accordingly, a CMOS circuit can be constructed as well. For example, in a liquid crystal display device operating on an active matrix mode, not only the active matrix but also the peripheral circuits (such as the driver circuit) can be established using polycrystalline TFTs in CMOS circuits, thereby giving a so-called monolithic structure.

The TFTs for use in SRAMs also make the best of the same advantage. The PMOS are constructed with the TFTs to use as the load transistor.

However, as compared with the amorphous TFTs, polycrystalline TFTs in general suffer a higher OFF current because of the larger field mobility, and hence are inferior in retaining the pixel charges in an active matrix. This disadvantage has not been regarded as a serious problem in the conventional matrix having a pixel size of several hundreds of micrometers square, however, with increasing elaboration and fineness of the pixels, the pixel capacitance decreases to make a stable and static display unfeasible.

Furthermore, the source and drain regions (referred to simply as "source/drain regions" or collectively, as "a source/drain region") cannot be established on an ordinary amorphous TFT by a self-aligning process as those commonly used in the single crystal integrated circuit (IC) technology. This leads to the problem of stray capacitance which generates by geometrical superposition of the gate electrodes and the source/drain regions. On the contrary, the self-aligning process can be applied to polycrystalline TFTs and hence the stray capacitance can be suppressed low.

More specifically, a conventional TFT comprises, as shown in FIG. 2, a substrate 201 having established thereon a source region 204, drain region 202, and a channel region 203, all at about the same thickness. In a TFT having fabricated by a self-aligning process, the channel region (activated layer) 203 is established at approximately the same shape as that of the gate electrode 205. A interlayer insulator 206, as well as drain and source electrodes 207 and 208, respectively, are also provided in the TFT as shown in FIG. 2.

The conventional polycrystalline TFTs are advantageous in some aspects as described above, but there are also some disadvantages that are pointed out. With respect to the problem of OFF current, several measures are proposed to present. One of such countermeasures is to reduce the thickness of the activated region. It has been reported that the OFF current can be reduced by establishing a thinner activated region. For example, it is reported that a channel region having a reduced thickness of 25 nm can suppress the OFF current to $10^{-13}$ A or lower. However, it is extremely difficult to crystallize the thin semiconductor film because the film would not readily crystallize. That is, an activated region (channel region) having a sufficiently high crystallinity to realize a practically useful field mobility requires annealing at a high temperature or annealing for a long duration. If a high temperature annealing were to be applied, a heat-resistant substrate such as of quartz is necessary. However, a quartz substrate is expensive, and particularly so for a large area quartz substrate. The use of a large-area quartz substrate is therefore economically disadvantageous. If an annealing for a long duration were to be applied, the throughput decreases, and again, the process results in poor economy.

Furthermore, making the activated layer thinner signifies reducing the thickness of the source/drain regions. This arises from the fact that, in a commonly employed fabrication process, the source/drain regions are fabricated at the same time with the activated region. Thinner source/drain regions mean an increase of resistance in these regions. To avoid this increase in resistance, another step for depositing thicker source/drain regions must be added. However, such an additional step is unfavorable from the viewpoint of yield.

Moreover, the present inventors have found that a MOS having fabricated from a TFT with an activated layer of 50 nm or less yields a low threshold voltage. Accordingly, when such TFTs are fabricated into a CMOS, the resulting product would suffer an extremely unstable operation.

If the activated layer is provided thicker, on the other hand, the OFF current increases but not in linear relation with the thickness of the activated layer. Hence, it is expected that the OFF current is increased non-linearly due to some reason. Characteristic curves for TFTs each having a 100 nm thick activated layer are given in FIG. 3(A). The TFT comprises a gate oxide film 150 nm in thickness, and an activated layer having fabricated by low-pressure chemical vapor deposition (LPCVD) process followed by annealing at 600° C. for 24 hours. The voltage between the source and the drain is 1 V. It can be seen from FIG. 3(A) that the both ON and OFF currents are large. Moreover, a shoulder-like anomaly can be observed to appear when a reversed bias is applied to the gate electrode.

When the activated layer is thickly provided, a TFT having a high electric field mobility results because a favorable crystallinity is obtained for the activated layer. No special high temperature annealing or long annealing is necessary in this case. As a result of the study of the present inventors, it has been found that the majority of the OFF current in the thick activated layer flow via the substrate side of the activated layer like flowing through a by-path. The flow path is indicated with an arrow 209 in FIG. 2. The ON/OFF ratio of a TFT can be expressed ideally by $I_{ON}/I_{OFF}$, where $I_{ON}$ and $I_{OFF}$ each represent the ON and OFF currents, respectively. When there is a leakage current $I_{LK}$ which flows through a by-path almost independently to the gate voltage, the ON/OFF ratio is expressed by $(I_{ON}+I_{LK})/(I_{OFF}+I_{LK})$. In practice, $I_{LK}$ is estimated to be far larger than $I_{OFF}$, but smaller than $I_{ON}$. Hence the apparent ON/OFF ratio is expressed by $I_{ON}/I_{LK}$. It can be seen that the ON/OFF ratio, which is an important index for a TFT, appears to be extremely reduced in this case.

The leakage current above in general occurs by the following two reasons. One is the poor crystallinity of the activated layer on the substrate side. Too many grain boundaries in this side of the activated layer generate many trap levels that the charge migrates by hopping along these trap levels. Since the trap levels are present irrespective of the presence of a gate voltage, they permanently serve as offset current sources. Theoretically, this problem can be overcome by optimizing the conditions for crystal growth, but with a great difficulty.

The other problem resides on the activated layer being rendered conductive on the substrate side because of the movable ions, such as sodium and the like, which have been incorporated into the activated layer from the substrate side. This problem can be solved by increasing the cleanness of the process.

Even if the problem of the leakage current were to be overcome by either of the measures above, the OFF current increases ohmically when the channel layer (activated layer) is thick. On the contrary, the resistivity of the source/drain is sufficiently small because the thickness thereof is thick enough.

SUMMARY OF THE INVENTION

A TFT ideally is expected to have a high field mobility and a low resistivity for the source/drain. The OFF current is preferably small. However, a complicated process should not be incorporated into the fabrication. The present invention has been accomplished with an aim to overcome the problems mentioned hereinbefore, and to provide a nearly ideal TFT.

Accordingly, the present invention provides a TFT which utilizes only the preferred portions of the activated layer as the channel; the substrate side of the activated layer, i.e., the side having inferior characteristics because of the poor crystallinity, the remaining movable ions, etc., is left over.

More specifically, the substrate side of the activated layer is fabricated with a semiconductor material having a larger band gap and a smaller mobility than the other side of the activated layer, i.e., the gate insulator side, so that this portion may not function substantially as a channel. Then, the leakage current can be reduced considerably in this region having a large band gap. The other side of the activated layer, i.e., the gate insulator side is constructed with a semiconductor having large mobility and a crystalline structure, which may be any of the semi-amorphous, polycrystalline, and single crystal semiconductors. These semiconductors are referred hereinafter collectively as crystalline semiconductors.

A semiconductor device in accordance with the present invention comprises:
a substrate having an insulating surface;
a pair of source and drain regions provided on the surface of said substrate;
a semiconductor layer extending between said source and drain regions and having a first region where the first region functions as a channel; and
a gate electrode adjacent to said semiconductor layer with an insulator therebetween,
wherein said semiconductor layer includes a second region adjacent to said first region so that the first region intervenes between the insulator and the second region and the second region has a lower orderliness than said first region.

BRIEF DESCRIPTION OF THE DRAWINGS

FIGS. 8(A)-8(D) illustrate schematically the fabrication steps of a TFT according to another embodiment of the present invention;

DETAILED DESCRIPTION OF THE INVENTION

When the gate insulator side of the activated layer is made of a semi-amorphous silicon or a polycrystalline silicon or a single crystal silicon, a preferred material having a large band gap to be combined therewith include silicon based semiconductors such as silicon oxide ($SiO_{2-x}$; with x being larger than 0 and less than 2, and preferably, x is larger than 0.1 and less than 2), silicon nitride ($Si_3N_{4-x}$; with x being larger than 0 and less than 4, and preferably, x is larger than 0.375 and less than 4), silicon carbide ($SiC_{1-x}$; with x being larger than 0 and less than 1, and preferably, x is larger than 0.05 and less than 1), and a compound thereof expressed by $SiC_{1-x}N_{1.33-y}O_{2-z}$, where x being larger than 0 and less than 1, y being larger than 0 and less than 1.33, and z being larger than 0 and less than 2. Otherwise, the material having a large band gap may be an amorphous semiconductor material such as amorphous silicon. These materials are preferred because, for example, as compared with the energy band gap of 1.1 eV of crystalline silicon semiconductor, amorphous silicon yields a large energy gap in the range of from 1.2 to 1.8 eV. That is, the leakage current can be minimized, because the activated layer on the substrate side has a larger band gap than that on the gate insulator side.

Furthermore, though amorphous silicon cannot be annealed by a normal annealing at about 600° C. (depending on the fabrication process and the concentration of hydrogen), it can be annealed by applying an intense energy, for example, by laser annealing, to thereby establish a crystalline silicon. A TFT having still favorable characteristics can be obtained by taking advantage of crystalline silicon.

Figure 1:
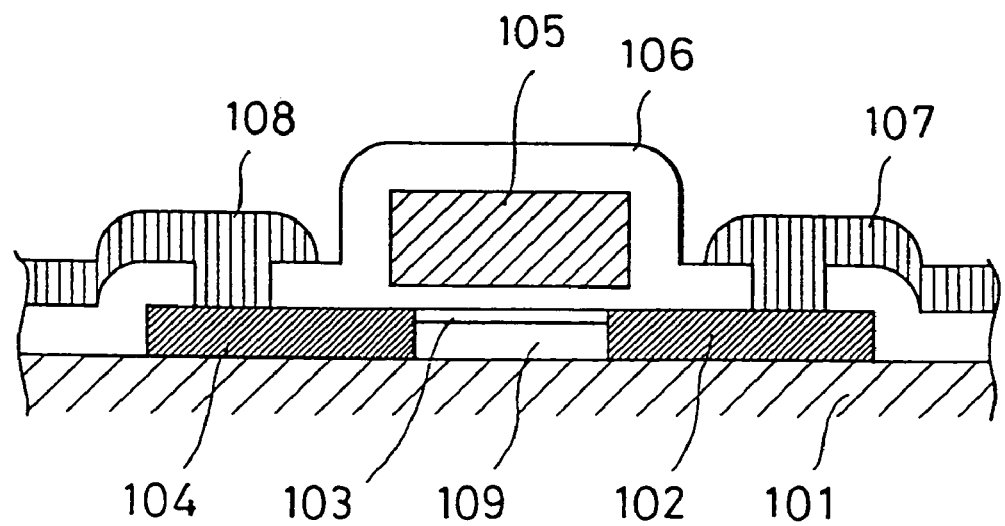
FIG. 1 shows schematically a TFT according to an embodiment of the present invention.
Figure 2:
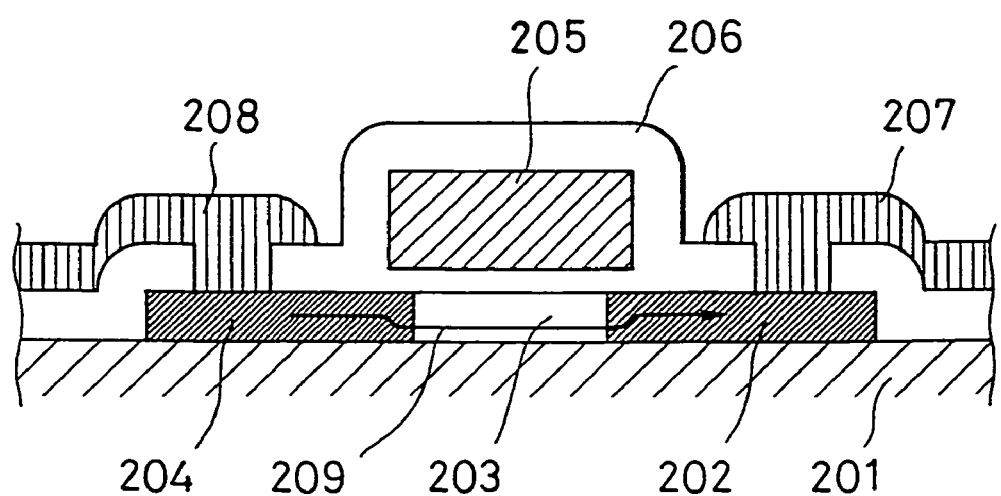
FIG. 2 shows schematically a conventional TFT.

Referring to FIG. 1, which shows schematically a TFT according to an embodiment of the present invention, the structure thereof is described. The TFT comprises an insulator substrate 101 having provided thereon a source region 104 and a drain region 102 sandwiching therebetween a channel region 103. A region 109 made of a semiconductor having a larger band gap than that of the channel region 103 is provided under the channel region 103. When the channel region 103 is fabricated with crystalline silicon semiconductor, the region 109 is preferably made from a semiconductor material based on silicon, such as silicon oxide ($SiO_{2-x}$; with x being larger than 0 and less than 2, and preferably, x is larger than 0.1 and less than 2), silicon nitride ($Si_3N_{4-x}$; with x being larger than 0 and less than 4, and preferably, x is larger than 0.375 and less than 4), silicon carbide ($SiC_{1-x}$; with x being larger than 0 and less than 1, and preferably, x is larger than 0.05 and less than 1), and a compound thereof expressed by $SiC_{1-x}N_{1.33-y}O_{2-z}$, where x being larger than 0 and less than 1, y being is larger than 0 and less than 1.33, and z being larger than 0 and less than 2. The effective amount of addition of those silicon based semiconductors is $8\times10^{19}$ cm$^{-3}$ or more. If the addition is less than $8\times10^{19}$ cm$^{-3}$, no effect can be expected. In case of the addition of oxygen, oxygen is contained in the region 109 at $8\times10^{19}$ cm$^{-3}$ or more and at 190 volume % or less of silicon. In case of the addition of nitrogen, nitrogen is contained in the region 109 at $8\times10^{19}$ cm$^{-3}$ or more and at 125 volume % or less of silicon. In case of the addition of carbon, carbon is contained in the region 109 at $8\times10^{19}$ cm$^{-3}$ or more and at 95 volume % or less of silicon. The semiconductors having the composition in the preferred range as described above do not function as a channel due to the large band gap. The crystalline silicon semiconductor in the gate insulator side alone serves as the channel. The concentration of carbon, nitrogen, and oxygen of the crystalline silicon semiconductor is preferably as low as possible with respect to the silicon based semiconductor which is provided under the crystalline silicon semiconductor, so that the addition of the additional elements above may not influence the band gap. Specifically, the concentration of carbon, nitrogen, and oxygen preferably is not higher than $7\times10^{19}$ cm$^{-3}$.

The fact that the semiconductors mentioned above cannot be easily crystallized signifies that they have less grain boundaries and that thereby the leakage current which occurs as a hopping current via the grain boundaries is low. This structure can be realized by first depositing the semiconductor film of the material enumerated above, and then establishing thereon a coating which serves as the channel.

The region 109 as shown in FIG. 1 may have an amorphous structure and comprise a material which is substantially an amorphous semiconductor, such as amorphous silicon. Amorphous semiconductors, an amorphous silicon for example, have a large band gap, a low mobility, and a high resistivity. Accordingly, the leakage current thereof is extremely low. In this case again, a coating which functions as crystalline silicon is deposited on a coating which yields an amorphous silicon, and the whole structure obtained as a result is subjected to an ordinary self aligning process to fabricate a TFT.

The present inventors have found that the coatings obtained by differing the substrate temperature each yield different characteristics. For example, in a film deposition process using monosilane gas as the starting material (raw material), no crystallized film was obtained by annealing at 600° C. a film having deposited at a substrate temperature in the range of from 430 to 480° C. In contrast, a crystalline silicon film in a semi-amorphous to a polycrystalline state was obtained by depositing a film in the temperature range of from 520 to 560° C. and annealing it at a temperature of 600° C. for 12 hours.

It can be seen from the aforementioned experimental results that a preferred structure comprising a lower amorphous silicon film on the substrate side and an upper crystalline silicon film thereon can be obtained by first depositing an amorphous silicon film at the substrate temperature range of from 430 to 480° C. e.g. by low pressure chemical vapor deposition, then continuously or discontinuously elevating the substrate temperature to a range of from 520 to 560° C. to deposit an amorphous silicon film e.g. by low pressure chemical vapor deposition, and finally annealing the whole structure by subjecting the whole structure to thermal treatment in the temperature range of from 550 to 750° C., preferably, from 560 to 650° C., and more preferably, from 580 to 650° C. If the annealing temperature is too high, crystallization proceeds deep into the lower layer to give crystalline silicon. It should be noted also that the crystallization occurs depending on the material gas used. For example, a film having deposited using disilane undergoes crystallization during annealing at 600° C., even though the film is deposited at a substrate temperature of 480° C.

The double-layer structured silicon film thus obtained is then subjected to self-aligning process to incorporate impurities to the portions intended for source/drain regions. At this step, the upper crystalline silicon turns into amorphous silicon, and the impurities reach to a sufficiently deep portion of the structure. Then, the whole structure is subjected to laser annealing and the like to effect recrystallization. Thus, the whole structure, including the lower portion, i.e., the amorphous coating, is crystallized simultaneously. The channel portion under the gate electrode and the further lower portion thereof remain the initial crystalline state because the laser beam cannot reach to these portions. Thus, a structure maintaining the initial state, i.e., a crystalline silicon channel portion having formed on a lower portion made of amorphous silicon, is obtained as a result.

It can be seen that the thickness of the source/drain regions can be adjusted to the total thickness of the channel region 103 and the region 109 (the double-layer structured silicon film and the source and drain regions have substantially the same thickness), and thereby the thickness of the channel region can be reduced as compared with that of the source/drain regions (thickness of the source and drain regions is larger than thickness of the channel region). The structure of this TFT is almost the same as that of the TFT intended for in the present invention.

Referring to FIG. 1, a boundary is clearly shown between the channel region 103 and the underlying portion 109. However, considering the scope of the claim of the present invention, such a boundary need not be present. That is, a material having a gradually changing distribution of impurities, compositional elements, crystal structure, etc., can be favorably used in the present invention.

A source/drain region having a uniform electric characteristics, such as resistivity, along the thickness direction is most favorable for the TFT of the present invention. In such a case, it results in an ideal TFT having source/drain with a thickness being substantially smaller than that of the channel, a thin channel, and a large resistivity (sheet resistivity) for the source/drain.

Figure 3A:
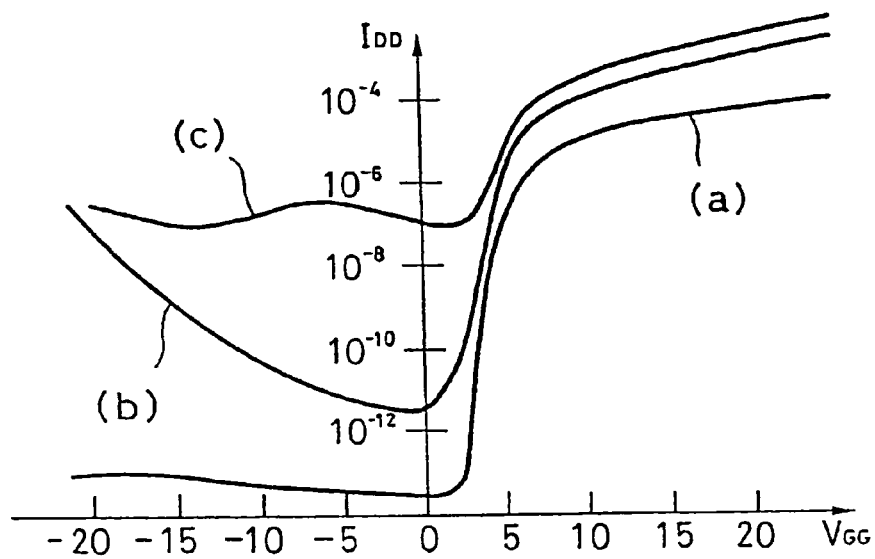
FIG. 3(A) shows typical characteristic curves for a TFT according to an embodiment of the present invention and for a conventional TFT.
Figure 3B:
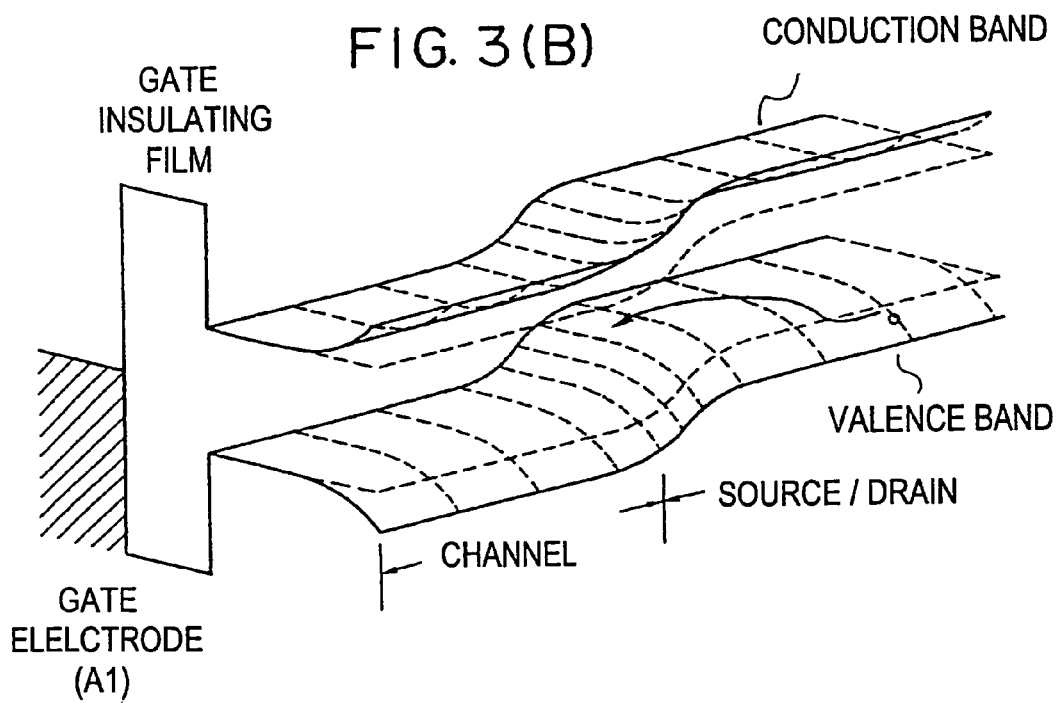
FIG. 3(B) shows schematically the energy band of a TFT according to the present invention.
Figure 6A:
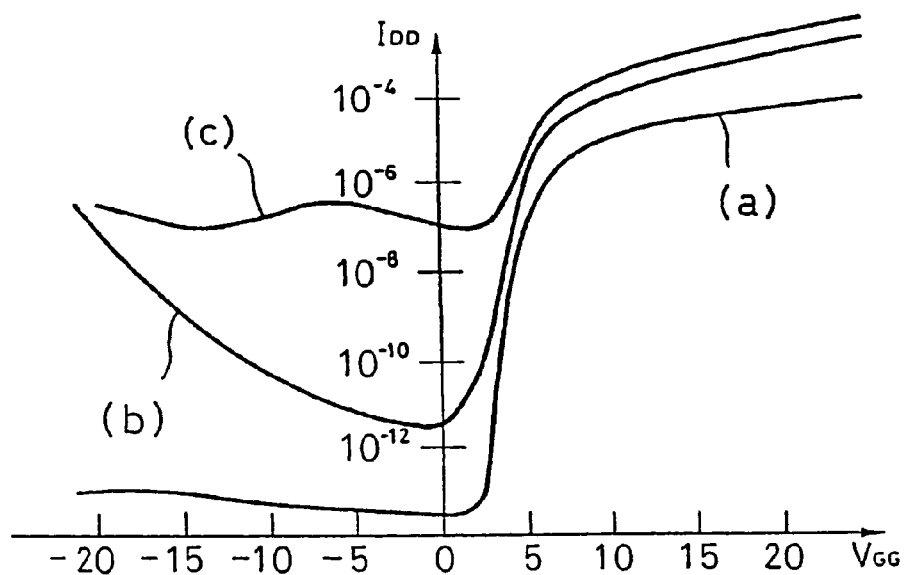
FIG. 6(A) shows typical characteristic curves for a TFT according to an embodiment of the present invention and for a conventional TFT.
Figure 6B:
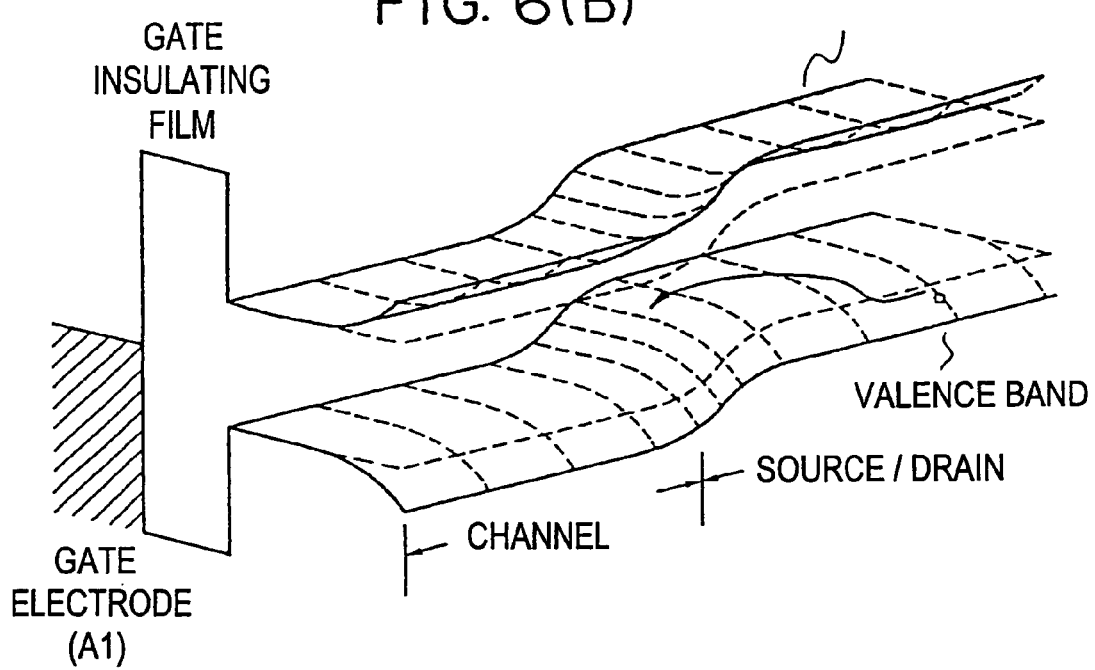
FIG. 6(B) shows schematically the energy band of a TFT according to the present invention.

A band gap as illustrated in FIG. 3(B) and FIG. 6(B) is assumable for the TFT according to the present invention. That is, the band gap for the TFT described in FIG. 1, i.e., a structure comprising a source/drain, a channel, and a lower portion is illustrated in FIGS. 3(B) and 6(B). The structure shown in those figures correspond to that of a PTFT, but a similar structure can be depicted for an NTFT. It can be read from the band figure that the holes in the valence band (the electrons in the conduction band for an NTFT) cannot intrude into the region 109 under the channel because the region 109 has a large band gap. Thus, it results in a minimized leakage current because the path therefor is completely cut off.

A TFT further improved in characteristics can be obtained by establishing an amorphous semiconductor region 109 having a conductivity type opposite to that of the source/drain regions. More specifically, a P-type amorphous region 109 is established for an NTFT, and an N-type amorphous region 109 for a PTFT. As the mobility has no influence in these regions, a P-type region can be easily deposited. The leakage current from the source to the drain via the region 109 can be eliminated by incorporating a junction of regions having opposite conductivity types as described above. The region 103 is substantially intrinsic.

The present invention can be directly applied to a conventional TFT, but a further favorable effect can be expected by applying it to a TFT having an offset region as disclosed in Japanese Patent Application Nos. 3-231188 and 3-238713, which are both the inventions of the present inventors. The TFTs disclosed in those applications were effective for reducing the OFF current and for preventing reversed leakage current from occurring when a reverse potential is applied to the gate electrodes, but the absolute value of the OFF current was yet to be lowered. By applying the present invention to the TFTs disclosed in the previous applications, TFTs having a suppressed reverse leakage current and a low absolute OFF current can be realized. As a result, TFTs having a high ON/OFF ratio can be obtained.

An effect which results from the present invention is depicted in FIG. 3(A). In the figure, the characteristic curve denoted with (c) is for a conventional TFT (NTFT), and that with (b) is for a TFT to which the present invention is applied. More specifically, curve (b) shows the characteristics of a TFT comprising a channel region made of a crystalline silicon being deposited on a polycrystalline material expressed by $SiC_{0.2}$. Silicon gates are used in this case. It can be seen that the OFF current at the gate voltage of 0 is considerably reduced as compared with that of a conventional TFT, but that the reverse leakage current is still high. In this case, it is believed that the channel turns P-type conductive by the negative gate potential, and that the band structure for the source/drain (N type) and the channel (P type) results in a broken state. Accordingly, in a poorly crystalline semiconductor such as a polycrystalline semiconductor, a hopping current is assumed to generate via the levels which are present in the boundary thereof.

Another example of the present invention is depicted in FIG. 6(A). In the figure, the characteristic curve denoted with (c) is for a conventional TFT (NTFT), and that with (b) is for a TFT to which the present invention is applied. More specifically, curve (b) is the characteristic curve of a TFT comprising a channel region made of a crystalline silicon being deposited on an amorphous silicon. Silicon gates are used in this case. It can be seen that the OFF current at the gate voltage of 0 is considerably reduced as compared with that of a conventional TFT, but that the reverse leakage current remains still high. It is believed that the channel turns P-type conductive by the negative gate potential, and that the band structure for the source/drain (N type) and the channel (P type) results in a broken state. Accordingly, in a poorly crystalline semiconductor such as a polycrystalline semiconductor, a hopping current is assumed to generate via the levels which are present in the grain boundary thereof.

By applying the present invention to a TFT having an offset region and equipped with an aluminum gate as disclosed in Japanese Patent Application 3-231188, a favorable characteristic curve having a reduced reverse leakage current can be obtained as shown with curve (a) in FIGS. 3(A) and 6(A). However, even if the present invention were to be applied to a TFT having an offset region as disclosed in Japanese Patent Application Nos. 3-231188 and 3-238713, no substantial effect can be expected on those having poor intergranular (e.g., grain boundary) characteristics. This is ascribed to the fact that the reverse leakage current originates from the level which is present in the grain boundary as explained above; there is no considerable significance in providing an offset region to a semiconductor having inferior grain boundary characteristics.

In short, the TFTs having an offset region as disclosed in the foregoing Japanese Patent Application Nos. 3-231188 and 3-238713 should be fabricated paying special attention to the characteristics of the semiconductor material used therein. In this context, a synergetic effect can be expected by combining the present invention with the TFTs above as disclosed in Japanese Patent Application Nos. 3-231188 and 3-238713, because in the resulting TFTs, the portion having inferior characteristics (the substrate side of the activated layer) are substantially not used as channels.

In the foregoing, descriptions were made for only those TFTs having a simple source/drain structure or an offset region. However, the present invention is also applicable to known TFTs having a low density drain (LDD) structure. Furthermore, the LDD structured TFTs include those having fabricated by a conventional process and those obtained by a process as disclosed in Japanese Patent Application Nos. 3-238710, 3-238711, and 3-238712 of the present inventors.

The present invention is illustrated in greater detail referring to non-limiting examples below. It should be understood, however, that the present invention is not to be construed as being limited thereto.

Example 1

Figure 4:
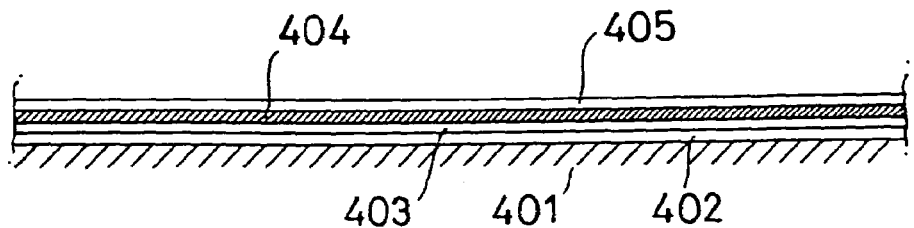
FIGS. 4(A)-4(D) illustrate schematically the fabrication steps of a TFT according to an embodiment of the present invention.
Figure 4:
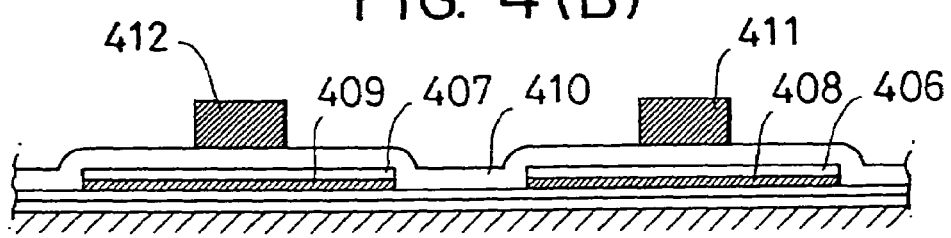
Figure 4:
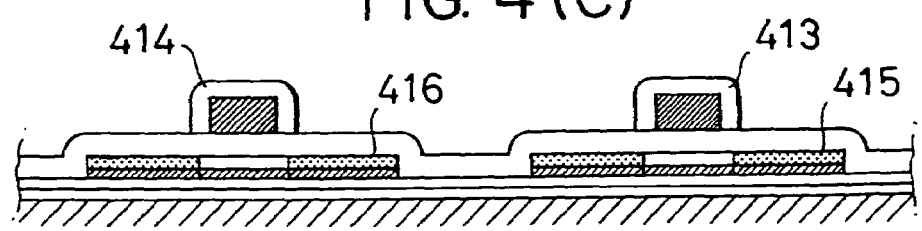
Figure 4:
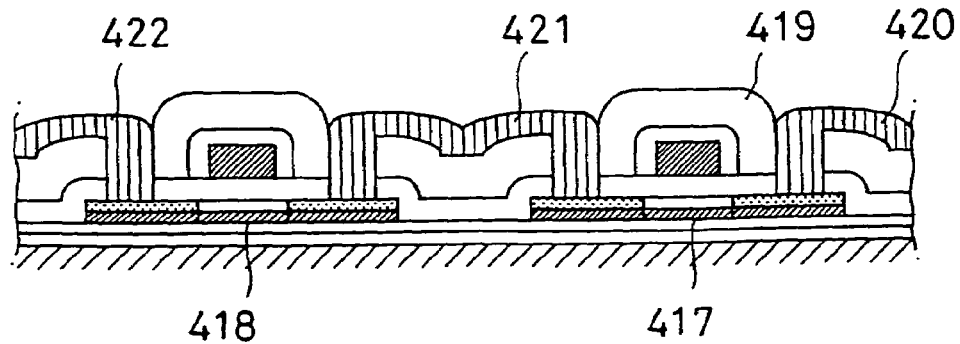

Referring to FIG. 4, a process for fabricating a CMOS according to an embodiment of the present invention is described below. On a glass substrate 401 (No. 7059, a product of Corning Incorporated) was first deposited a silicon nitride film 402 using RF plasma enhanced CVD (referred to simply hereinafter as "RF plasma CVD") at a thickness of from 20 to 100 nm, for example, 50 nm, to prevent movable ions from intruding the upper structures from the substrate. A silicon oxide layer 403 was further deposited thereon by RF plasma CVD at a thickness of from 20 to 100 nm, for example, 50 nm. The thickness of the silicon nitride and silicon oxide films are designed appropriately by taking into account the degree of the intrusion of movable ions and the influence which affects the activated layer. For instance, if the silicon nitride film 402 having a poor quality and a large charge trap is deposited, the silicon oxide film must be deposited thicker so that the upper semiconductor layers may not be influenced by the silicon nitride film.

The aforementioned coatings may be deposited not only by plasma CVD processes as above, but also by other processes such as low pressure CVD (LPCVD) and sputtering. The means and methods may be properly selected by taking into account the factors such as the investment scale and the mass productivity. Needless to say, the coatings may be deposited continuously.

Then, an amorphous silicon carbide film 404 was deposited on the silicon oxide film of the resulting structure by RF plasma CVD at a thickness of from 20 to 200 nm, for instance, 100 nm. In general, the lower silicon oxide layer and the channel of the TFT on the substrate become more stable with increasing thickness of the silicon carbide film 404. However, too thick a coating takes a long time for the deposition and hence is not favorable from the viewpoint of mass production. A silicon carbide coating 20 nm or less in thickness has no effect for cutting off the influence from the substrate. Thus, a preferred silicon carbide coating must be deposited in the thickness range of from 20 to 200 nm. The optimal thickness of the film can be determined by considering various conditions for obtaining the desired TFT. The silicon carbide coating deposited here was such having a composition expressed by $SiC_{0.2}$, however, the composition of the film is not limited thereto and it may be varied according to the intended characteristics of the TFT, as well as to the characteristics of the silicon oxide film provided as the base coating and the silicon nitride film. The energy band gap for this amorphous $SiC_{0.2}$ coating is about 2.2 eV.

Subsequently, an amorphous silicon film 405 was further deposited to a thickness of from 20 to 200 nm, for example, 100 nm, using a multi-chamber system RF plasma CVD process, so that the deposition process may take place continuously without exposing the substrate to air. Monosilane gas was used as the reacting material, and the substrate was maintained at 550° C. As explained in the foregoing, the present inventors have found through their study that the substrate temperature and the material gas to be used in the process greatly influence the subsequent crystallization of the amorphous silicon. For instance, a film having deposited from monosilane at a substrate temperature of 480° C. could be hardly crystallized. In contrast to this, a film having deposited from disilane, even if it were deposited at a substrate temperature of 480° C., could be crystallized sufficiently by the subsequent annealing at 600° C. The amorphous silicon film thus deposited was thermally annealed at 600° C. for 24 hours for crystallization to thereby obtain a film of crystalline silicon, i.e., a so-called semi-amorphous silicon film.

The concentration of carbon, oxygen, and nitrogen in the amorphous silicon film 405 is preferably controlled to $7 \times 10^{19}$ $cm^{-3}$ or less to thereby accelerate the crystallization of film. In the present example, the concentration of such additives was confirmed to be $1 \times 10^{17}$ $cm^{-3}$ or less by secondary ion mass spectroscopy (SIMS) analysis. The silicon carbide film 404 remained uncrystallized under the present crystallization condition.

In the conventional TFTs, the fabrication thereof should have to be conducted with great care because an activated layer of the semiconductor coating was deposited adjacent to the silicon oxide coating 403. For example, the intrusion of a mobile ion into the silicon oxide coating 403 had to be strictly avoided. The presence of a trap level in the silicon oxide coating was even more fatal. The incorporation of movable ions into the silicon oxide coating could be prevented to some extent by increasing cleanness of the process, but the problem of the trap level could not be improved beyond a certain limit because of the process confinement. In particular, the boundary level density between the silicon oxide film and the overlying activated layer of the semiconductor was a key factor which determines the characteristics of the resulting TFT. In an ordinary MOS IC fabricated from a single crystal semiconductor, the level density at the interface between the thermally oxidized gate insulator (silicon oxide film) and the single crystal semiconductor is about $10^{10}$ $cm^{-2}$. A structure obtained by processes such as RF plasma CVD, low pressure CVD (LPCVD), and atmospheric pressure CVD (APCVD) as in the present example suffered a high level density at the boundary between the silicon oxide film and the overlying polycrystalline of $10^{12}$ $cm^{-2}$ or higher, and hence it was far from being practical.

In a structure having a large boundary level density, various types of charges are trapped at the boundary that the conductivity type of the activated layer becomes dependent on these charges and not on the gate voltage. This leads to an increase of leakage current. Accordingly, in a conventional TFT, a high quality well comparable to that of the gate insulator was required for also the base oxide film. In a low to middle temperature processes in which no thermal oxidation were applicable, film deposition had to be conducted by sputtering or by ECR plasma CVD. In these cases again, the level density at the boundary also suffered a high value which was larger by about one figure than that of the structures obtained by thermal oxidation process.

However, the process according to the present invention is free from the conventional problems because the portion on the silicon oxide film 403 to be brought into contact with the silicon oxide coating is constructed with a semiconductor material having a large band gap. Even if a trap were to be present in the silicon oxide coating 403 and if a charge were to be trapped therein, the large band gap prevents the layer from functioning as a channel that the trapped charges cast no influence on the channel layer.

Accordingly, the silicon oxide coating can be deposited by applying an RF plasma CVD and other simple CVD processes mentioned hereinbefore. The RF plasma CVD as well as the low pressure CVD and atmospheric pressure CVD processes are superior to sputtering and ECR plasma CVD processes from the view point of mass production. In using sputtering, a batch method cannot be employed in the process, and care must be taken so that the movable ions may not adhere to the target. Furthermore, the coating area is limited by the target which is limited in size, and hence the process is not suited for depositing films having a large area. With respect to ECR plasma CVD, the investment for the apparatus is too high; moreover, there are also limitations in number and size of the substrates which are to be treated with the apparatus.

The crystalline silicon film obtained by thermally annealing the amorphous silicon film in the precedent step was then patterned properly by etching to form island-like semiconductor regions 407 and 406 for the NTFT and PTFT, respectively. Each of the island-like regions comprises a silicon carbide layer 409 (for NTFT) or 408 (for PTFT). The upper portion of each of the island-like portions was found to be substantially an intrinsic semiconductor.

Then, a gate insulator (silicon oxide) 410 was deposited by sputtering at a thickness of 150 nm in an oxygen atmosphere using silicon oxide as the target. The thickness of the oxide coating is determined according to the operating conditions and the like of the TFT.

An aluminum coating was deposited on the structure thus obtained at a thickness of 500 nm by sputtering, followed by patterning using a mixed acid (a phosphoric acid solution containing 5% nitric acid) as the etchant. Thus were established gate electrodes with connections 411 and 412. The etching rate in this case at an etching temperature of 40° C. was 225 nm/minute. The outer appearance of the TFT was adjusted in this manner. The TFT comprised a channel 8 μm in length and 20 μm in width. The resulting structure is shown in FIG. 4(B).

The surface of the aluminum connection was further coated with aluminum oxide by anodic oxidation. The details for the anodic oxidation are disclosed in Japanese Patent Application Nos. 3-231188 and 3-238173 of the present inventors. The process disclosed therein are used by slightly modifying the details depending on the characteristics of the desired device, process conditions, investment scale, and the like. In this example, 350 nm thick aluminum oxide coatings 413 and 414 were formed by anodic oxidation.

Then, with the aid of a known technology for fabricating CMOS, an N-type source/drain region 416 and a P-type source/drain region 415 were established by ion implantation. The impurity concentration was controlled to be $8 \times 10^{19}$ $cm^{-3}$. Boron fluoride ions and phosphorus ions were used as the ion source for the P-type region and the N-type region, respectively. The ion implantation was conducted at an accelerating voltage of 80 keV and 110 keV for the P- and N-type region, respectively. The accelerating voltage must be determined by considering the thickness of the gate insulator and the semiconductor regions 406 and 407. An ion doping process may be used as an alternative to ion implantation. The ion implantation process is advantageous in that the desired ions only are implanted because the ions are separated by the mass thereof, however, the size of the substrate is limited. In contrast to this, the ion doping process has an allowance for relatively large substrates (e.g., such as those 30 inches or more in diagonal), but hydrogen ions and other unwanted ions are all accelerated and injected into the substrate. Accordingly, substrates subjected to ion doping tend to be heated up. Furthermore, unlike to ion implantation, selective impurity implantation using a photoresist as a mask cannot be conducted by ion doping.

In this manner, a TFT having an offset region was obtained as shown in FIG. 4(C). Finally, the source/drain region was recrystallized by laser annealing using the gate electrode portion as the mask. The conditions for the laser annealing were the same as those disclosed in, for example, Japanese Patent Application Nos. 3-231188 and 3-238713. This step was followed by depositing silicon oxide by RF plasma CVD as an interlayer insulator 419, and the resulting silicon oxide coating was perforated to establish therethrough aluminum connections 420 to 422 to obtain a finished device.

The silicon carbide layer under the source/drain regions did not crystallize during laser annealing. Assumably, that silicon carbide portion had not served substantially as a source/drain, despite it had been doped with impurities. As shown in the figure, the initial silicon carbide layers 408 and 409 remained as regions 417 and 418 under the channels of the TFTs.

Example 2

Referring to FIG. 5, a process for fabricating an NTFT and PTFT according to an embodiment of the present invention is described below. On a glass substrate 501 (N—O glass, a product of Nippon Electric Glass Co., Ltd.) was first deposited a silicon nitride film 502 using RF plasma assisted CVD at a thickness of from 20 to 100 nm, for example, 50 nm, to prevent movable ions from intruding the upper structures from the substrate. The N—O glass substrate employed in the present example is higher in glass transition temperature by about 150° C. as compared to the Corning 7059 used in Example 1. Hence, the N—O glass substrate can be used effectively in an annealing in the temperature range of 650 to 750° C. However, it requires a sufficient countermeasure to be taken for the movable ions because movable ions are present in the substrate in a large amount. A silicon oxide layer 503 was further deposited thereon by RF plasma CVD at a thickness of from 20 to 200 nm, for example, 100 nm.

Then, a silicon carbide film 504 expressed by compositional formula $Si_{0.7}C_{0.3}$ was deposited on the silicon oxide film of the resulting structure by RF plasma CVD at a thickness of from 10 to 50 nm, for instance, 30 nm. Then, the silicon carbide film was coated with a photoresist 507 to use as a mask for establishing a P-type region 506 and an N-type region 505. The P-type region was formed by ion-doping boron at a concentration of $2 \times 10^{13}$ $cm^{-2}$. Similarly, the N-type region was formed using phosphorus as the impurity at a concentration of $5 \times 10^{13}$ $cm^{-2}$. The accelerating voltage of 10 keV was the same for both regions. Thus was obtained a structure as shown in FIG. 4(A).

Then, an amorphous silicon film was deposited at a substrate temperature of 550° C. by low pressure CVD to a thickness of from 10 to 150 nm, for example, 10 nm. The concentration of carbon, oxygen, and nitrogen in the amorphous silicon film should be controlled to $7 \times 10^{19}$ $cm^{-3}$ or less, and the concentration of such additives in the film thus obtained was confirmed to be $1 \times 10^{17}$ $cm^{-3}$ or less by secondary ion mass spectroscopy (SIMS) analysis. The amorphous silicon film thus deposited was thermally annealed in the temperature range of from 600 to 750° C., for instance, at 650° C. for 48 hours for crystallization to thereby obtain a film of crystalline silicon, i.e., a so-called semi-amorphous silicon film. The silicon carbide film 504 was partially crystallized, but the degree of crystallization was low.

In a conventional TFT, the fabrication thereof should have to be conducted with great care as mentioned in Example 1 because an activated layer of the semiconductor coating was deposited adjacent to the silicon oxide coating 503. In the process according to the present invention, however, the semiconductor film 504 which is later deposited on the silicon oxide film 503 is not used substantially as a channel region. Thus, the conventional problems need not be considered. That is, even if a trap were to be present in the silicon oxide coating 503 and if a charge were to be trapped therein, the large band gap of the semiconductor coating 504 prevents the layer from functioning as a channel that the trapped charges cast no influence on the channel layer. Hence, there cannot be expected a leakage current to occur depending on the level of the boundary between the semiconductor coating 504 and the silicon oxide film 503. In particular, the effect of the present invention can be further enhanced by providing in the semiconductor coating 504, an impurity region having a conductivity type opposite to that of the source/drain of each TFT. Then, the RF plasma CVD as described above can be applied to deposit the silicon oxide film.

The crystalline silicon film obtained by thermally annealing the amorphous silicon film in the precedent step was then patterned properly by etching, to form island-like semiconductor regions 509 and 508 for the NTFT and PTFT, respectively. The upper portion of each of the island-like portions was found to be substantially an intrinsic semiconductor.

Then, a gate insulator (silicon oxide) 510 was deposited by sputtering at a thickness of 150 nm in an oxygen atmosphere using silicon oxide as the target. The thickness of the oxide coating was determined according to the operating conditions and the like of the TFT.

Figure 5A:
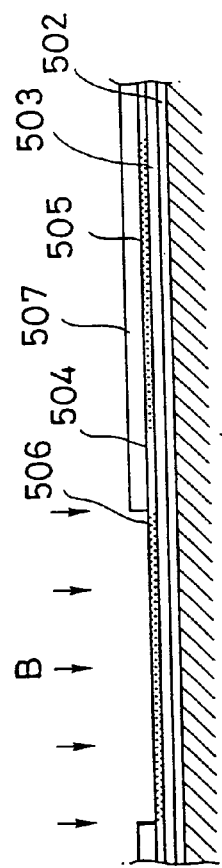
FIGS. 5(A)-5(D) illustrate schematically the fabrication steps of a TFT according to another embodiment of the present invention.
Figure 5B:
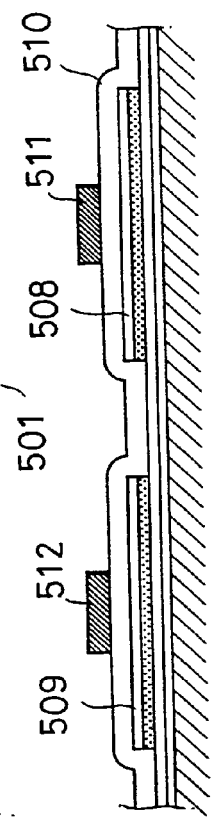
Figure 5C:
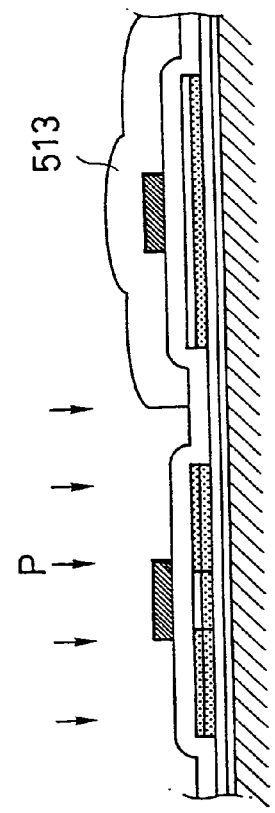

A silicon coating containing phosphorus at a concentration of $1.2 \times 10^{20}$ cm$^{-3}$ was deposited on the structure thus obtained at a thickness of 500 nm by low pressure CVD, followed by patterning to establish gate electrodes with connections 511 and 512. The outer appearance of the TFT was adjusted in this manner. The TFT comprised a channel 8 μm in length and 20 μm in width. The resulting structure is shown in FIG. 5(B).

Then, with the aid of a known technology for fabricating CMOS, the source/drain regions for each of the TFTs were established by ion implantation through the gate insulator. More specifically, PTFT was covered with a photoresist 513 during the formation of the source/drain regions for the NTFT, and the NTFT was covered with the photoresist for the formation of the source/drain regions of the PTFT.

Figure 5D:
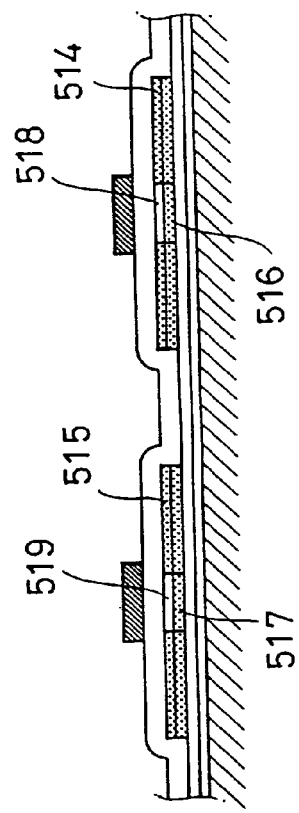

The structure thus obtained was annealed at 600° C. for 24 hours to recover for the damage which it had suffered by ion implantation. In this manner, an N-type source/drain region 515 and a P-type source/drain region 514 were established as shown in FIG. 5(D). It can be seen also that the P- and N-type silicon carbide regions 516 and 517 were left under the channel of each of the TFTs.

Example 3

Referring to FIG. 9, a process for fabricating an NTFT and PTFT according to an embodiment of the present invention is described below. On a glass substrate 601 (AN glass, a product of Asahi Glass Co., Ltd.) was first deposited a silicon nitride film 602 using low pressure CVD at a thickness of from 20 to 50 nm to prevent movable ions from intruding the upper structures from the substrate. A silicon oxide layer 603 was further deposited thereon by sputtering to a thickness of from 800 to 1,000 nm.

Figure 9A:
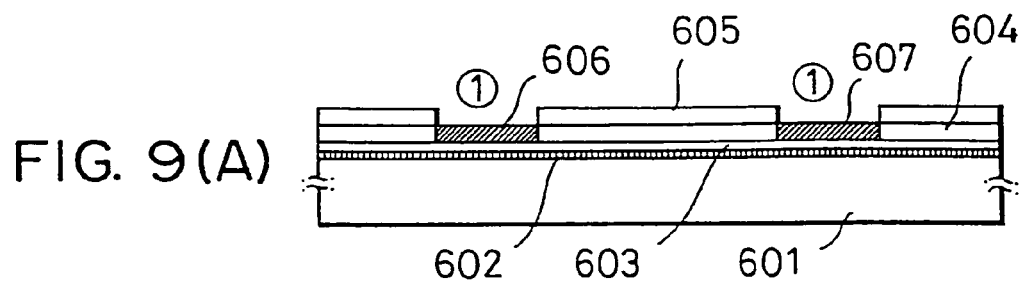
FIGS. 9(A)-9(E) illustrate schematically the fabrication steps of a TFT according to another embodiment of the present invention.

Then, a silicon film 604 was deposited at a substrate temperature of 550° C. by low pressure CVD to a thickness of 100 nm. The surface of the resulting silicon film was coated with a photoresist, and this step was followed by patterning using a mask ①. The structure thus obtained was then subjected to, for example, ion doping, to incorporate at least one of carbon, nitrogen, and oxygen at a dose of $8 \times 10^{19}$ cm$^{-3}$ or more. These elements need not be incorporated in excess, because such ion doping takes too long a time as to impair productivity. Furthermore, a prolonged doping treatment charges up the substrate to lower the doping efficiency. It is therefore preferred to dope the substrate with a least necessary amount. In the present example, the silicon layer was bombarded with oxygen to a dose of from $2 \times 10^{20}$ to $5 \times 10^{21}$ cm$^{-3}$. In this manner, regions 606 and 607 were formed under the channels of PTFT and NTFT, respectively as shown in FIG. 9(A).

Figure 9B:
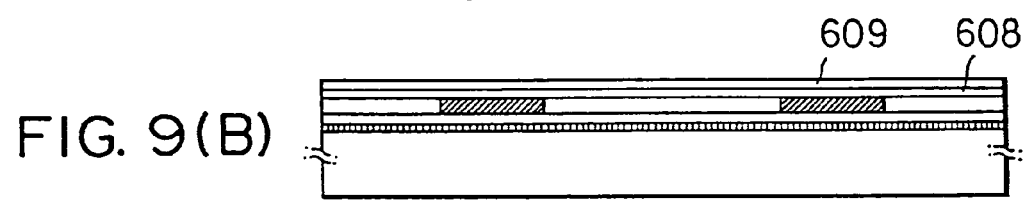

Then, as shown in FIG. 9(B), a 20 nm thick silicon film 608 was deposited again by low pressure CVD. A silicon oxide film as the protective film was deposited thereon by sputtering at a thickness of from 50 to 200 nm, for example, 70 nm. The structure was then subjected to annealing for 24 hours in the temperature range of from 550 to 650° C., preferably in the range of from 590 to 610° C., to crystallize the silicon film. The non-stoichiometric silicon oxide regions 606 and 607 remained almost non-crystallized on annealing, but the silicon film 604 underwent favorable crystallization. The crystal growth proceeded to the second silicon film 608 to completely crystallize also the film 608.

Alternatively, laser annealing using an excimer laser can be conducted instead of thermal annealing. The laser annealing process using an excimer laser is described in Japanese Patent Application No. 3-50793 of the present inventors. The yield of this process is low due to the fluctuation in the laser power output, however, semiconductors having high mobility can be obtained.

After establishing a PTFT region 610 and an NTFT region 611 using a mask ②, a gate insulator (silicon oxide) 612 was newly deposited after removing the protective layer 609. On the gate insulator thus obtained was further deposited an aluminum coating at a thickness of from 250 to 500 nm, and this aluminum coating was further covered with a silicon oxide coating from 150 to 700 nm in thickness. The structure obtained as a result was patterned using a mask ③ to establish a gate electrode portion 613 for the PTFT and an overlying cap 615, as well as a gate electrode portion 614 for the NTFT covered with a cap 616. The caps may be made of a material such as silicon nitride.

The caps 615 and 616 were provided for improving insulation between the connections on establishing later a three-dimensional connection. They also facilitate connections between the layers on boring holes on the upper surface of the gate connection. Because aluminum oxide is a material not suited for etching, the etching conditions are different from those generally employed for interlayer insulating materials such as silicon oxide. This can be illustrated, for instance, by a process which comprises perforating an electrode hole through a layered structure obtained by superposing an aluminum oxide film and a silicon oxide interlayer insulator on a gate electrode having a connection. When a wet etching process is applied to such a structure, the hole in the silicon oxide film greatly extends while the aluminum oxide film remains intact, because the etching rate for the aluminum oxide film is different from that for the silicon oxide film. To circumvent such difficulties, the upper portion of the gate with connection should be provided using a material having the same etching rate as that of the interlayer insulator, and preferably, the same material as that used for the interlayer insulator is employed in the upper portion.

Figure 9C:
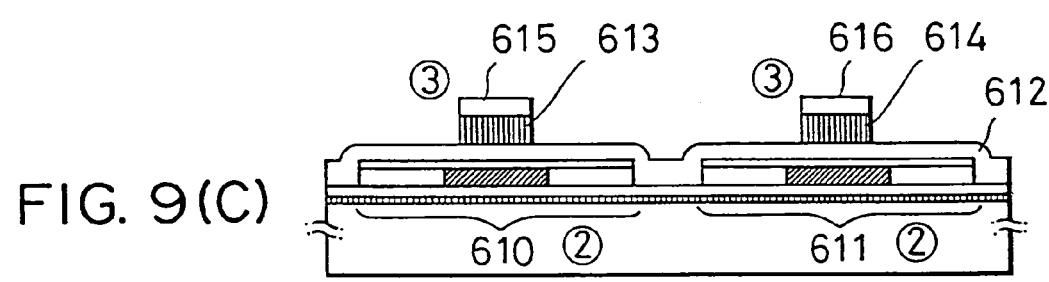

The use of silicon oxide particularly reduces the capacitance between the connection layers because the dielectric constant of silicon oxide is as small as 3.8 as compared with that of aluminum oxide which is 8. However, when such a structure is subjected to anodic oxidation, it is to be taken notice of the fact that the cap should endure a strain which generates on the aluminum oxide that is later provided to the side of the gate electrode. Should the cap material be not strong enough as to endure such a strain, the cap material may occasionally undergo peeling and fall off. Thus was obtained a device as shown in FIG. 9(C).

The aluminum gate connection was anodically oxidized to form 200 nm thick aluminum oxide coatings 619 and 621 on the side of gate electrodes. The surface of the gate electrode descends to leave gate electrodes 620 and 622 inside the coatings.

Figure 9D:
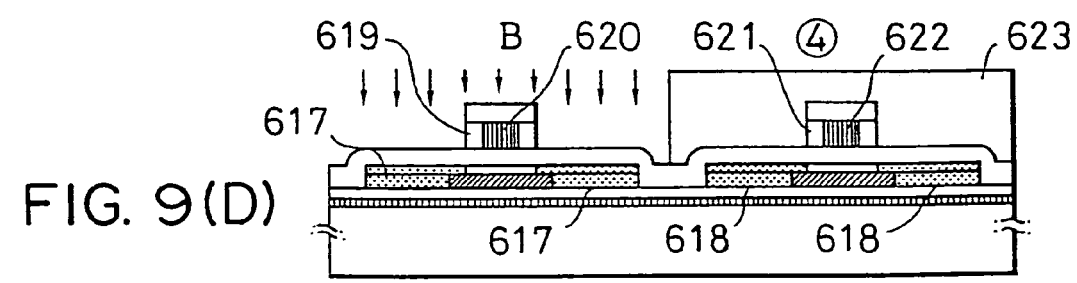

Then, the structure was bombarded with phosphorus ions by ion implantation to establish a phosphorus-doped region 618. The region 617 was also doped with phosphorus at the same time. The region 616 was then covered with a photoresist 623 having obtained by patterning with a mask ④, and boron ions (marked with B in the figure) were implanted into the region 617 alone. The resulting structure is shown in FIG. 9(D).

Figure 9E:
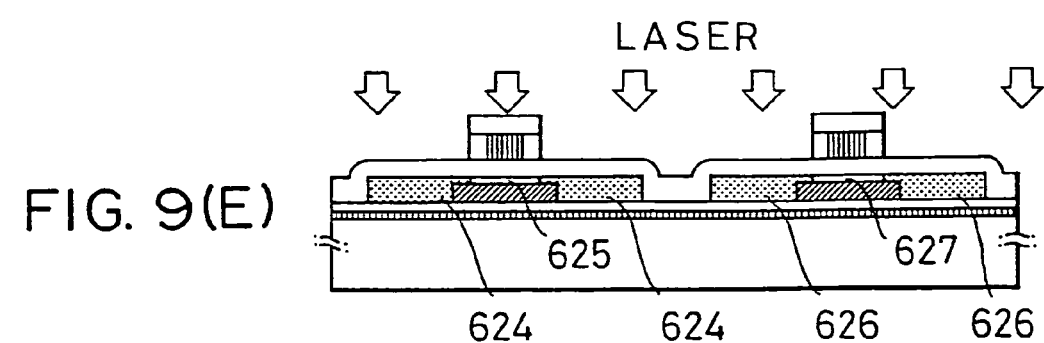

The regions 617 and 618 were crystallized by laser annealing in the same manner as in Example 1 to establish a P-type region 624 and an N-type region 626. The structure obtained as a result is shown in FIG. 9(E). On the other hand, the channel region was established in a self-aligned manner to the gate electrode through the process steps above to give channel regions 625 and 627 for the PTFT and NTFT, respectively. The channel regions were 20 nm thick each. As described in the foregoing, the silicon oxide layers 606 and 607 provided under the channels do not substantially function as channels in the structure of the present invention. The OFF current of the TFT was considerably reduced by incorporating such thin channel regions, and the ON resistivity was also lowered as a result by providing the majority of the source/drain regions thicker so as to reduce the resistance.

Though not shown in FIG. 9, a metal connection was formed on the structure shown up to the stage in which the gate electrodes of the TFTs and the impurity regions are provided. Thus was obtained a structure finished as TFTs.

Figure 10A:
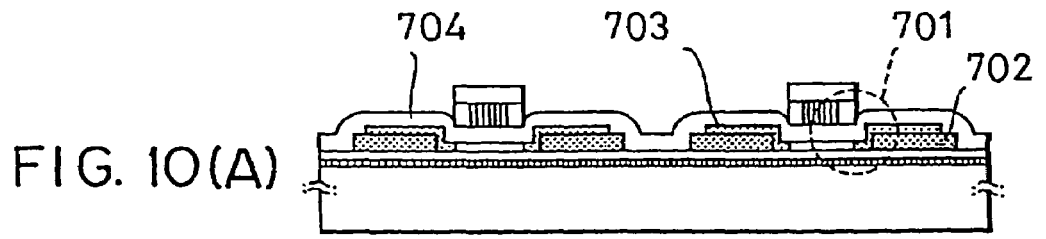
FIGS. 10(A)-(B) illustrate schematically conventional complementary TFTs.

It had been also a matter of concern in the conventional TFTs how to reduce the OFF current and the resistance of the source/drain regions. In a conventional TFT as shown in FIG. 10(A), accordingly, a thinner channel layer 703 had been provided, and a pad-shaped impurity region had been incorporated to reduce the resistance of the source/drain regions. At least four masks, i.e., one for establishing a pad region 702, one for depositing a channel layer 703, one for establishing a gate electrode and connection, and one for forming a P-type region, are necessary to fabricate such a structure in a CMOS. The number of the masks necessary for fabricating the device is the same as that in the process according to the present invention. However, in the conventional process, additional problems arise with respect to leakage current and dielectric breakdown. Such problems result from uneven thickness of the gate insulator, due to the formation of steps in the channel layer and the gate insulator of the TFT as indicated with 701 in the figure.

Figure 10B:
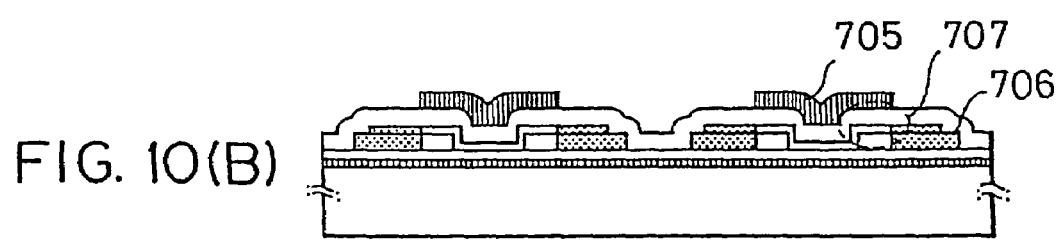

In FIG. 10(B) is shown an improved structure for that shown in FIG. 10(A). The thin portions of the channel layer is reduced. The resistance of the source/drain regions can be certainly reduced by taking such a structure. However, the problems which originate from the presence of steps, as shown with 707 in the figure, remain yet to be solved. Though the solution for this being to form a tapered pad portion, it is still unfavorable because an additional step had to be incorporated in the process.

In contrast to the conventional processes, and as shown in FIG. 9, the one according to the present invention provides structures free of steps. The structure shown in FIG. 11 can be obtained by applying the present invention to the structure shown in FIG. 10(B). It can be seen clearly that the thin channel in the central portion is increased in thickness at the vicinity of the source/drain regions. The resistance of the source/drain regions can be effectively reduced by taking such a structure. Moreover, because the impurity regions 802, the channel regions 803, and the silicon oxide regions 804 are formed on substantially the same plane, no steps are formed. It can be seen therefore that the process according to the present invention provides devices having far higher reliability as compared with a conventional mask process using the same number of mask steps.

Furthermore, in the process according to the present invention, the energy for implanting ions (e.g., oxygen ions) can be controlled at the step illustrated in FIG. 9(A), so that the ions may be selectively implanted to the lower portion of the coating 604. Otherwise, the depth distribution of the implanted ions in the ion-bombarded layer can be controlled as desired by using an ion source having a wide energy distribution (the ion sources typically used in an ion doping process). In such cases, the surface of the regions 606 and 607 is preferably free of ions such as of oxygen.

Figure 11:
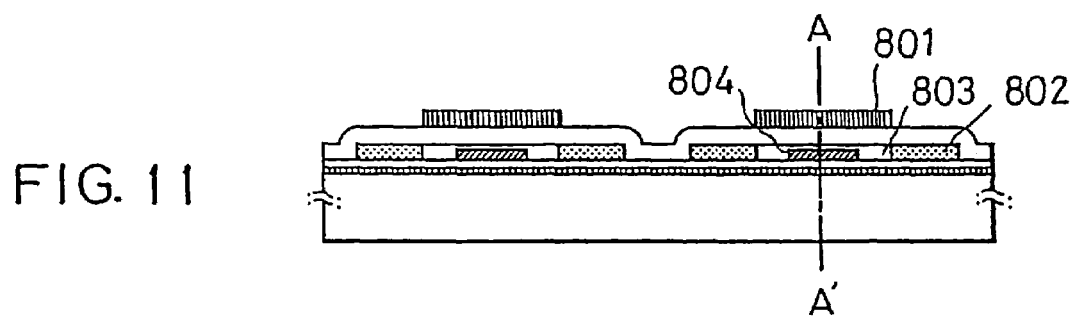
FIG. 11 illustrates schematically a complementary TFT according to an embodiment of the present invention.
Figure 12:
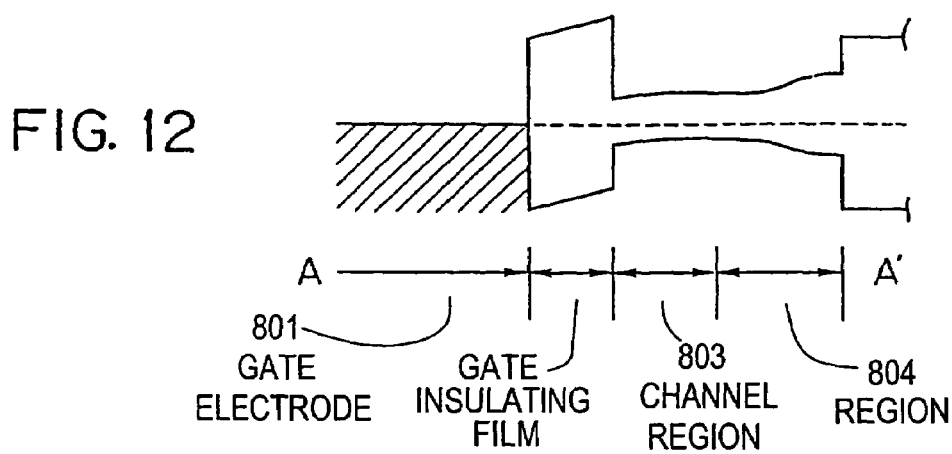
FIG. 12 shows schematically the energy band of a TFT according to the present invention.

In FIG. 11 is shown an example of a device fabricated by the controlled process described above. The energy band of the NTFT in the cross section along A-A' is given in FIG. 12. A steep energy band boundary can be easily formed between the silicon oxide layer 804 and the overlying silicon channel layer 803. In such a ease, however, a number of trap levels tend to form at the boundary due to defects which form in the boundary. Such trap levels often result in the formation of a leakage current between the source/drain regions. When a continuous energy band is formed as shown in FIG. 12, the formation of such trap levels in a high density can be avoided. Furthermore, because the charges can move relatively easily in the region 804 (of course, they are far less mobile as compared with those in an ordinary TFT operation), the charges are neutralized, and hence, fixed charges are unfeasible.

Example 4

Figure 13A:
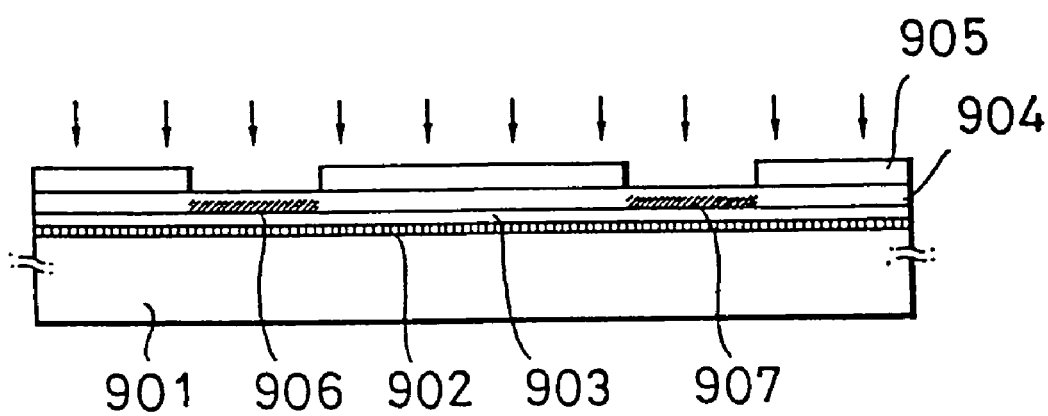
FIGS. 13(A)-(C) illustrate schematically the fabrication steps of a TFT according to another embodiment of the present invention.
Figure 13B:
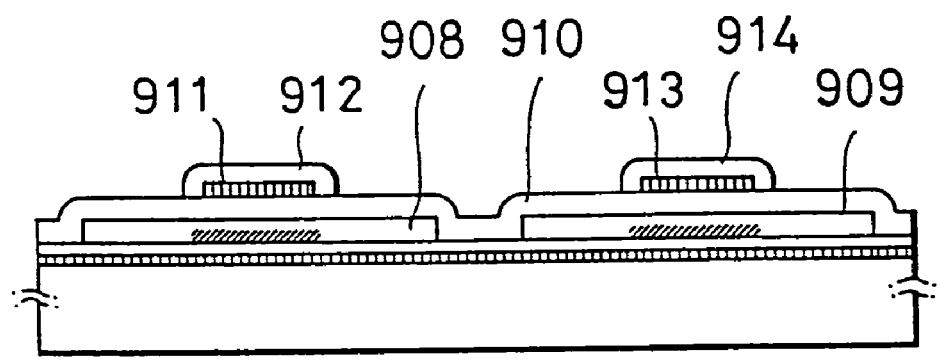

Referring to FIG. 13, a device according to an embodiment of the present invention is described. In the same manner as in the other examples described hereinbefore, a silicon nitride film 902 and a silicon oxide film 903 were deposited on a proper substrate 901. A silicon coating 904 was further deposited on the silicon oxide film 903. The structure thus obtained was surface coated with a photoresist 905, and was subjected to perforation using a photolithographic process. Oxygen ions were implanted to the resulting structure at the same dose as that employed in Example 3, except for using an ion implantation process under an ion accelerating energy of from 50 to 150 keV. In this manner, the oxygen ion distribution can be controlled as such that a peak may form at the vicinity of the boundary between the silicon layer 904 and the underlying silicon oxide layer 903, and that no oxygen ions may be present at the vicinity of the surface of the silicon layer 904. A precise control of the energy for accelerating ions and a homogeneous energy distribution are required to achieve a desired ion distribution. Thus were obtained $SiO_x$ (where x is larger than 0 and less than 2) regions 906 and 907. The silicon layer was then crystallized under the same conditions as those employed in Examples 1 and 3. The device thus obtained is shown in FIG. 13.

Subsequently, the silicon layer 904 was subjected to patterning in the same manner as in Example 1 to establish island-like regions 908 and 909, which was followed by the formation of gate insulator 910 and aluminum gate electrodes 911 and 913. The aluminum gate electrodes were each coated with aluminum oxide coatings 912 and 914 by anodic oxidation. The resulting structure is given in FIG. 13(B).

Figure 13C:
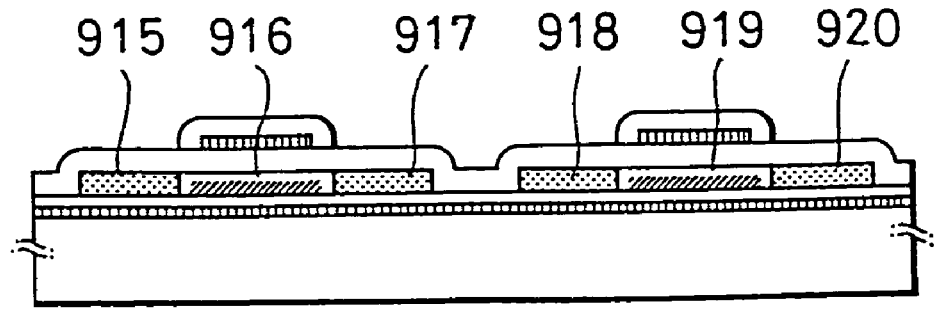

As a last step, the structure was subjected to ion implantation in the same manner as in Example 1 to dope the structure with impurity ions, and then to laser annealing to effect recrystallization. Thus were established P-type impurity regions 915 and 917, N-type impurity regions 918 and 920, a PTFT channel region 916, and an NTFT channel region 919. Thus was obtained a structure as shown in FIG. 13(C).

Because the distribution of the implanted oxygen was continuous in the present example, the energy band as observed in the cross section along the gate electrode to the substrate was qualitatively the same as that as shown in FIG. 11. The process of the present example is different from that of the Example 3 in that the depth distribution of the implanted oxygen ion is considered previously. Thus, in the process of the present example, the channel layer need not be established after conducting ion implantation. Accordingly, a device far improved in reliability can be fabricated by a process reduced in steps. In the process used in Example 3, the boundary may be contaminated for example, because the channel layer 803 and the silicon oxide layer 804 in FIG. 11 are not deposited continuously. The process of the present example is free of such concerns.

Example 5

Referring to FIG. 7, a process for fabricating a CMOS according to an embodiment of the present invention is described below. On a glass substrate 401 (No. 7059, a product of Corning Incorporated) was first deposited a silicon nitride film 402 using RF plasma assisted CVD at a thickness of from 5 to 200 nm, for example, 10 nm, to prevent movable ions from intruding the upper structures from the substrate. Other types of substrates may be used as well, but the substrate must be treated accordingly to the type so that mobile ions such as sodium may not intrude into the semiconductor coating. A most preferred but an expensive substrate is a synthetic quartz substrate having low alkali concentration, but if it cannot be afforded, a commercially available glass containing low alkali is used as an alternate. A silicon oxide layer 403 was further deposited thereon by RF plasma CVD at a thickness of from 20 to 1000 nm, for example, 50 nm. The thickness of the silicon nitride and silicon oxide films are designed appropriately by taking into account the degree of the intrusion of movable ions and the influence upon the activated layer. For instance, if the silicon nitride film 402 having a poor quality and a large charge trap is deposited, the silicon oxide film 403 must be deposited thicker so that the upper semiconductor layers may not be influenced by the silicon nitride film.

The aforementioned coatings may be deposited not only by plasma CVD processes as above, but also by other processes such as low pressure CVD (LPCVD) and sputtering. The means and methods may be properly selected by taking into account the factors such as the investment scale and the mass productivity. Needless to say, the coatings may be deposited continuously.

Then, an amorphous silicon film 404 was deposited on the silicon oxide film of the resulting structure by low pressure CVD to a thickness of from 20 to 200 nm, for instance, 100 nm. Monosilane was used as the reacting material. The substrate temperature was maintained in the temperature range of from 430 to 480° C., for example, at 450° C. Subsequently, the substrate temperature was continuously elevated to a range of from 520 to 560° C., for example, at 550° C., to deposit an amorphous silicon film 405 at a thickness of from 5 to 200 nm, for example, at a thickness of 10 nm. As explained in the foregoing, the present inventors have found through their study that the substrate temperature greatly influences the subsequent crystallization of the amorphous silicon. For instance, a great difficulty was found on crystallizing a film having deposited at a substrate temperature of 480° C. or lower, whereas a film having deposited at a substrate temperature of 520° C. or higher could be crystallized with ease. The amorphous silicon film thus deposited was thermally annealed at 600° C. for 24 hours for crystallization. As a result, only silicon film 405 crystallized to give a so-called semi-amorphous silicon film. The silicon film 404, on the other hand, remained amorphous.

The concentration of carbon, oxygen, and nitrogen in the amorphous silicon film 405 is preferably controlled to $7\times10^{19}$ $cm^{-3}$ or less to thereby accelerate the crystallization of film. In the present example, the concentration of such additives was confirmed to be $1\times10^{17}$ $cm^{-3}$ or less by secondary ion mass spectroscopy (SIMS) analysis.

In the conventional TFTs, the fabrication thereof should have to be conducted with great care because an activated layer of the semiconductor coating was deposited adjacent to the silicon oxide coating 403. For example, the intrusion of a mobile ion into the silicon oxide coating 403 had to be strictly avoided. The presence of a trap level in the silicon oxide coating was even more fatal. The incorporation of movable ions into the silicon oxide coating could be prevented to some extent by increasing cleanliness of the process, but the problem of the trap level could not be improved beyond a certain limit because of the process confinement. In particular, the boundary level density between the silicon oxide film and the overlying activated layer of the semiconductor was a key factor which determines the characteristics of the resulting TFT. In an ordinary MOS IC fabricated from a single crystal semiconductor, the level density at the interface between the thermally oxidized gate insulator (silicon oxide film) and the single crystal semiconductor is about $10^{10}$ $cm^{-2}$. A structure obtained by processes such as RF plasma CVD, low pressure CVD (LPCVD), and atmospheric pressure CVD (APCVD) as in the present example suffered a high level density at the boundary between the silicon oxide film and the overlying polycrystalline of $10^{12}$ $cm^{-2}$ or higher, and hence it was far from being practical.

In a structure having a large boundary level density, various types of charges are trapped at the boundary that the conductivity type of the activated layer becomes dependent on these charges and not on the gate voltage. This leads to an increase of leakage current. Accordingly, in a conventional TFT, a high quality well comparable to that of the gate insulator was required for also the base oxide film. In a low to middle temperature processes in which no thermal oxidation were applicable, film deposition had to be conducted by sputtering or by ECR plasma CVD. In these cases again, the level density at the boundary also suffered a high value which was larger by about one figure than that of the structures obtained by thermal oxidation process.

However, the process according to the present invention is free from the conventional problems because the portion on the silicon oxide film 403 to be brought into contact with the silicon oxide coating is constructed with amorphous silicon. Even if a trap were to be present in the silicon oxide coating 403 and if a charge were to be trapped therein, the amorphous silicon hardly functions as a channel that the trapped charges do not influence the conductivity type of the semiconductor film. It was found by the study of the present inventors that a level density to about $5\times10^{12}$ cm$^{-3}$ was allowable for the boundary between the silicon oxide film 403 and the overlying amorphous silicon film.

Accordingly, the silicon oxide coating can be deposited by applying an RF plasma CVD, low pressure CVD, atmospheric CVD, and other processes mentioned hereinbefore. The RF plasma CVD as well as the low pressure CVD and atmospheric pressure CVD processes are superior to sputtering and ECR plasma CVD processes from the view point of mass production. In using sputtering, a batch method cannot be employed in the process, and care must be taken so that the movable ions may not adhere to the target. Furthermore, the coating area is limited by the target which is limited in size, and hence the process is not suited for depositing films having a large area. With respect to ECR plasma CVD, the investment for the apparatus is too high; moreover, there are also limitations in number and size of the substrates which are to be treated with the apparatus.

The crystalline silicon film obtained by thermally annealing the amorphous silicon film in the precedent step was then properly patterned by etching to form island-like semiconductor regions 407 and 406 for the NTFT and PTFT, respectively. The upper portion of each of the island-like portions was found to be substantially an intrinsic semiconductor.

Then, a gate insulator (silicon oxide) 410 was deposited by sputtering at a thickness in the range of from 50 to 300 nm, for example, 150 nm, in an oxygen atmosphere using silicon oxide as the target. The thickness of the oxide coating was determined according to the operating conditions and the like of the TFT.

Figure 7A:
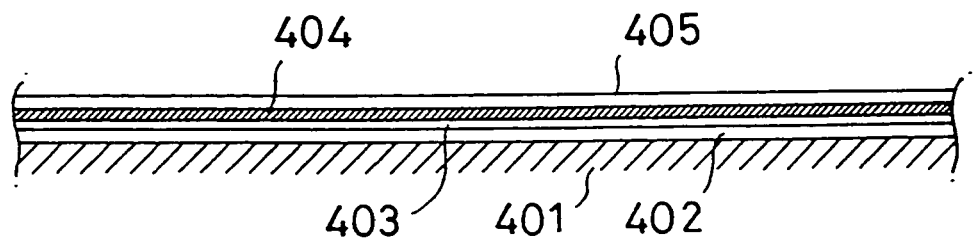
FIGS. 7(A)-7(D) illustrate schematically the fabrication steps of a TFT according to another embodiment of the present invention.
Figure 7B:
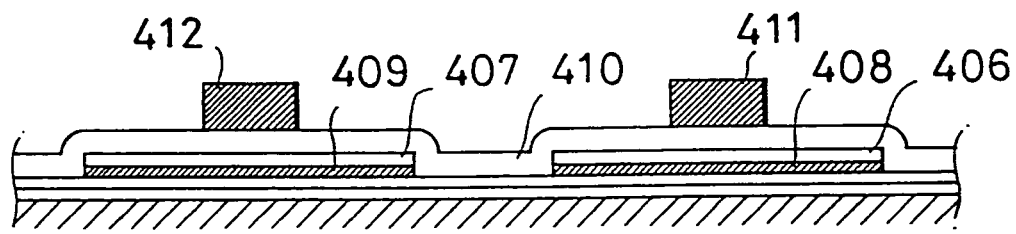

An aluminum coating was deposited on the structure thus obtained at a thickness of 500 nm by sputtering, followed by patterning using a mixed acid (a phosphoric acid solution containing 5% nitric acid) as the etchant. Thus were established gate electrodes with connections 411 and 412. The etching rate in this case at an etching temperature of 40° C. was 225 nm/minute. The outer appearance of the TFT was adjusted in this manner. The TFT comprised a channel 8 μm in length and 20 μm in width. The resulting structure is shown in FIG. 7(B).

The surface of the aluminum connection was further coated with aluminum oxide by anodic oxidation. The details for the anodic oxidation are disclosed in Japanese Patent Application Nos. 3-231188 and 3-238173 of the present inventors. The process disclosed therein are used by slightly modifying the details depending on the characteristics of the desired device, process conditions, investment scale, and the like. In this example, 350 nm thick aluminum oxide coatings 413 and 414 were formed by anodic oxidation.

Then, with the aid of a known technology for fabricating CMOS, an N-type source/drain region 416 and a P-type source/drain region 415 were established by ion implantation through the gate insulator. The impurity concentration was controlled to be $8\times10^{19}$ cm$^{-3}$. Boron fluoride ions and phosphorus ions were used as the ion source for the P-type region and the N-type region, respectively. The ion implantation was conducted at an accelerating voltage of 80 keV and 110 keV for the P- and N-type region, respectively. The accelerating voltage must be determined by considering the thickness of the gate insulator and the semiconductor regions 406 and 407. An ion doping process may be used as an alternative to ion implantation. The ion implantation process is advantageous in that the desired ions only are implanted because the ions are separated by the mass thereof, however, the size of the substrate is limited. In contrast to this, the ion doping process has an allowance for relatively large substrates (e.g., such as those 30 inches or more in diagonal), but hydrogen ions and other unwanted ions are all accelerated and injected into the substrate. Accordingly, substrates subjected to ion doping tend to be heated up. Furthermore, unlike to ion implantation, selective impurity implantation using a photoresist as a mask cannot be conducted by ion doping.

Figure 7C:
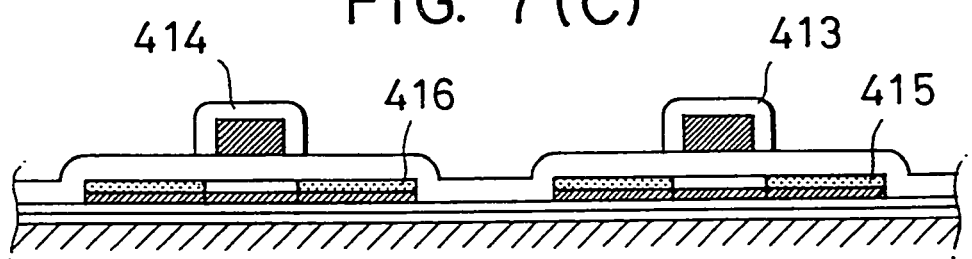

In this manner, a TFT having an offset region was obtained as shown in FIG. 7(C). Finally, the source/drain region was recrystallized by laser annealing using the gate electrode portion as the mask. The conditions for the laser annealing were the same as those disclosed in, for example, Japanese Patent Application Nos. 3-231188 and 3-238713. This step was followed by depositing silicon oxide by RF plasma CVD as an interlayer insulator 419, and the resulting silicon oxide coating was perforated to establish therethrough aluminum connections 420 to 422 to obtain a finished device.

Figure 7D:
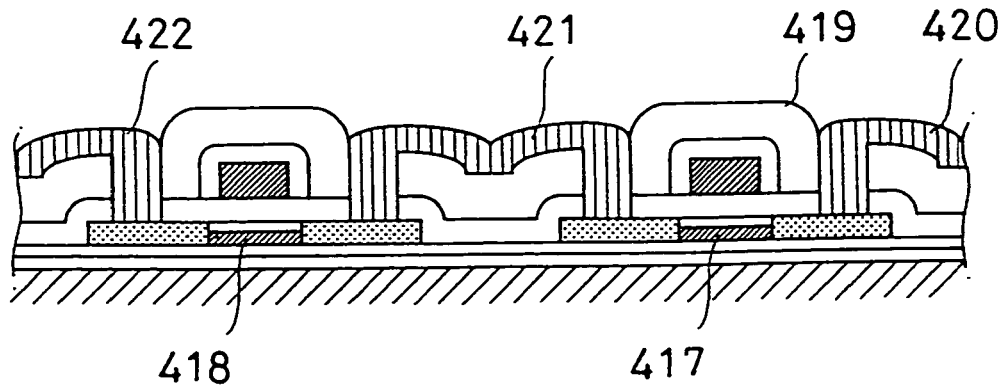

In the present Example, not only the coatings 406 and 407 which were originally a crystalline silicon, but also the amorphous silicon films 408 and 409 were crystallized by laser annealing. This is because laser annealing provides an intense energy. As a result, as shown in FIG. 7(D), the initially amorphous regions 408 and 409, except for the portions under the channels 417 and 418, were converted into a material having the same crystallinity as that of the source/drain. It can be seen that the thickness of the resulting source/drain became the same as that of the island-like semiconductor regions 407 and 408. However, the channel resulted thinner than the source/drain regions, at a thickness of about 10 nm as can be seen clearly in FIG. 7(D). This structure results in excellent characteristics, yielding a low sheet resistivity for the source/drain and a small OFF current due to the thin channel.

Example 6

Referring to FIG. 8, a process for fabricating a device according to an embodiment of the present invention is described below. On a glass substrate 501 (N—O glass, a product of Nippon Electric Glass Co., Ltd.) was first deposited a silicon nitride film 502 using RF plasma assisted CVD at a thickness of 50 nm to prevent movable ions from intruding the upper structures from the substrate. The N—O glass substrate employed in the present example is higher in glass transition temperature by about 150° C. as compared to the Corning 7059 used in Example 5. Hence, the N—O glass substrate can be used effectively in an annealing in the temperature range of 650 to 750° C. However, it requires a sufficient countermeasure to be taken for the movable ions because movable ions are present in the substrate in a large amount. A 100 nm thick silicon oxide layer 503 was further deposited thereon by RF sputtering. Then, an amorphous silicon film 504 was deposited on the silicon oxide film of the resulting structure by low pressure CVD at a substrate temperature of from 430 to 480° C., for example, at 450° C., to a thickness of from 10 to 50 nm, for instance, 30 nm. Then, the amorphous silicon film was coated with a photoresist 507 to use as a mask for establishing a P-type region 506 and an N-type region 505. The P-type region was formed by ion-doping boron at a concentration of, for example, $2\times10^{13}$ cm$^{-2}$. Similarly, the N-type region was formed using phosphorus as the impurity at a concentration of, for example, $5\times10^{13}$ cm$^{-2}$. The accelerating voltage of 10 keV was the same for both regions. Thus was obtained a structure as shown in FIG. 8(A). The step of establishing impurity regions is not necessary from the viewpoint of the process according to the present invention, however, the presence of such impurity regions further increases the effect of the present invention.

Then, an amorphous silicon film was deposited at a substrate temperature of from 520 to 560° C., for example, 550° C., by low pressure CVD to a thickness of from 10 to 150 nm, for example, 10 nm. The concentration of carbon, oxygen, and nitrogen in the amorphous silicon film should be controlled to $7\times10^{19}$ cm$^{-3}$ or less, and the concentration of such additives in the film thus obtained was confirmed to be $1\times10^{17}$ cm$^{-3}$ or less. The amorphous silicon film thus deposited was thermally annealed in, for example, hydrogen atmosphere, at 600° C. for 24 hours for crystallization. Thus was obtained a film of crystalline silicon, i.e., a so-called semi-amorphous silicon film. The amorphous silicon film 504 having deposited before was not crystallized. However, it was confirmed that the defects having formed by the previous ion implantation were recovered by the annealing in hydrogen atmosphere.

In a conventional TFT, the fabrication thereof should have to be conducted with great care as mentioned in Example 5, because an activated layer of the semiconductor coating had been deposited adjacent to the silicon oxide coating 503. In the process according to the present invention, however, the inert semiconductor film 504, such as of amorphous silicon, which is later deposited on the silicon oxide film 503 is not used substantially as a channel region. Thus, the conventional problems need not be considered. That is, even if a trap were to be present in the silicon oxide coating 503 and if a charge were to be trapped therein, the amorphous silicon film 504 does not function as a channel due to the large band gap of the amorphous silicon film 504 that the trapped charges pose no influence on the channel layer. Hence, there cannot be expected a leakage current to occur depending on the level of the boundary between the semiconductor coating 504 and the silicon oxide film 503. In particular, the effect of the present invention can be further enhanced by providing in the semiconductor coating 504, an impurity region having a conductivity type opposite to that of the source/drain of each TFT. Then, not only the RF sputtering as described above but also the processes which yield more unfavorable boundaries, such as RF plasma CVD and DC plasma CVD, can be applied to the deposition of the silicon oxide film.

The crystalline silicon film obtained by thermally annealing the amorphous silicon film in the precedent step was then patterned properly by etching to form island-like semiconductor regions 509 and 508 for the NTFT and PTFT, respectively. The upper portion of each of the island-like portions was found to be substantially an intrinsic semiconductor comprising crystalline silicon.

Then, a gate insulator (silicon oxide) 510 was deposited by sputtering at a thickness of 150 nm in an oxygen atmosphere using silicon oxide as the target. The thickness of the oxide coating was determined according to the operating conditions and the like of the TFT.

A chromium was deposited on the structure thus obtained at a thickness of 500 nm by sputtering, which was then subjected to patterning to establish gate electrodes with connections 511 and 512. The outer appearance of the TFT was adjusted in this manner. The TFT comprised a channel 8 μm in length and 20 μm in width. The resulting structure is shown in FIG. 8(B).

Then, with the aid of a known technology for fabricating CMOS, the source/drain regions for each of the TFTs were established by ion implantation through the gate insulator as shown in FIG. 8(C). More specifically, PTFT was covered with a photoresist 513 during the formation of the source/drain region for the NTFT, and the NTFT was covered with the photoresist for the formation of the source/drain region for the PTFT.

The structure thus obtained was annealed by laser annealing using the gate electrode as the mask to recover for the damage which it had suffered by ion implantation. At this step, the initially non-crystalline silicon region, i.e., the lower amorphous silicon region also underwent crystallization. The conditions for the laser annealing were the same as those disclosed in Japanese Patent Application Nos. 3-231188 and 3-238713. In this manner, an N-type source/drain region 515 and a P-type source/drain region 514 were established as shown in FIG. 8(D). It can be seen also that the amorphous silicon regions 516 and 517 were left under each of the channels of the TFTs.

In the present example, the initial impurity regions 505 and 506 were established with an impurity concentration of about $10^{18}$ cm$^3$. However, because impurities were implanted at a concentration 100 times as large as that of the regions 505 and 560 or even higher to establish the source/drain except for the portions under the channels, the initial impurity regions 505 and 506 were rendered conductive to have the same conductivity type as that of the source/drain, as is shown in FIG. 8(D). Accordingly, the resulting source/drain happened to have the same thickness as that of the island-like semiconductor regions 508 and 509, i.e., a thickness of 40 nm in total of the 30 nm thick amorphous silicon layer and the 10 nm thick crystalline silicon layer. However, the real thickness of the channel was, as is clearly read from the figure, about 10 nm, far thinner than the source/channel region. This resulted in a device having excellent characteristics, yielding a low sheet resistance for the source/drain and also a low OFF current owing to the thin channel.

As described in the foregoing, the present invention enables fabrication of TFTs having extremely low OFF current when a reverse voltage is applied to the gate. The present invention can be made effective use of by combining it with previous inventions. For example, a further effect can be expected by combining the present example with the inventions made by the present inventors and disclosed in, for example, Japanese Patent Application Nos. 3-231188 and 3-238713. In the present invention, furthermore, the sheet resistance can be reduced by increasing the thickness of source/drain as was shown in the Examples, to thereby realize TFTs capable of high speed operation.

In particular, conventional polycrystalline TFTs suffered too low an ON/OFF ratio to be applied for purposes such as active matrices of liquid crystal display devices. Hence, polycrystalline TFTs had been believed practically unfeasible for such devices. However, the present invention provides a solution for the problem. Furthermore, it can be understood that the present invention can be effectively applied to a TFT for use in constructing three-dimensional single crystal semiconductor integrated circuits. Needless to say, the present invention greatly contributes to the industry.

While the invention has been described in detail and with reference to specific examples thereof, it will be apparent to one skilled in the art that various changes and modifications can be made therein without departing from the spirit and scope thereof.

What is claimed is:

1. A semiconductor device comprising:
   a gate electrode;
   a gate insulating film adjacent to the gate electrode;
   a first semiconductor layer in contact with the gate insulating film wherein the gate insulating film is interposed between the gate electrode and the first semiconductor layer, the first semiconductor layer including a channel region;

a second semiconductor layer adjacent to the first semiconductor layer wherein the first semiconductor layer is interposed between the gate insulating film and the second semiconductor layer;

a second insulating film in contact with the second semiconductor layer wherein the second semiconductor layer is interposed between the first semiconductor layer and the second insulating film, wherein the first semiconductor layer comprises semi-amorphous silicon and the second semiconductor layer comprises amorphous silicon.

2. The semiconductor device according to claim 1, wherein the gate electrode is located over the gate insulating film.

3. The semiconductor device according to claim 1, further comprising source and drain regions wherein the source and drain regions partly overlap with the gate electrode.

4. The semiconductor device according to claim 1, wherein the first semiconductor layer is thinner than the second semiconductor layer.

5. The semiconductor device according to claim 1, wherein a concentration of carbon, oxygen or nitrogen in the second semiconductor layer is larger than that in the first semiconductor layer.

6. A semiconductor device comprising:
a gate electrode;
a gate insulating film adjacent to the gate electrode;
a first semiconductor layer in contact with the gate insulating film wherein the gate insulating film is interposed between the gate electrode and the first semiconductor layer, the first semiconductor layer including a channel region;
a second semiconductor layer adjacent to the first semiconductor layer wherein the first semiconductor layer is interposed between the gate insulating film and the second semiconductor layer;
a second insulating film in contact with the second semiconductor layer wherein the second semiconductor layer is interposed between the first semiconductor layer and the second insulating film,
wherein the first semiconductor layer comprises crystals suspended in an amorphous texture and the second semiconductor layer comprises amorphous silicon.

7. The semiconductor device according to claim 6, wherein the gate electrode is located over the gate insulating film.

8. The semiconductor device according to claim 6, further comprising source and drain regions wherein the source and drain regions partly overlap with the gate electrode.

9. The semiconductor device according to claim 6, wherein the first semiconductor layer is thinner than the second semiconductor layer.

10. The semiconductor device according to claim 6, wherein a concentration of carbon, oxygen or nitrogen in the second semiconductor layer is larger than that in the first semiconductor layer.

11. The semiconductor device according to claim 1 wherein the second semiconductor layer has a larger band gap than the first semiconductor layer.

12. The semiconductor device according to claim 6 wherein the second semiconductor layer has a larger band gap than the first semiconductor layer.

13. A semiconductor device comprising:
a gate electrode;
a gate insulating film adjacent to the gate electrode;
a first semiconductor layer in contact with the gate insulating film wherein the gate insulating film is interposed between the gate electrode and the first semiconductor layer, the first semiconductor layer including a channel region;
a second semiconductor layer adjacent to the first semiconductor layer wherein the first semiconductor layer is interposed between the gate insulating film and the second semiconductor layer;
a second insulating film in contact with the second semiconductor layer wherein the second semiconductor layer is interposed between the first semiconductor layer and the second insulating film,
wherein the first semiconductor layer comprises crystalline silicon and the second semiconductor layer comprises amorphous silicon, and
wherein a concentration of oxygen, nitrogen and carbon in the first semiconductor layer is $7\times10^{19}$ cm$^3$ or less.

14. The semiconductor device according to claim 13, wherein the gate electrode is located over the gate insulating film.

15. The semiconductor device according to claim 13 wherein a concentration of oxygen in the second semiconductor layer is higher than that in the first semiconductor layer.

16. The semiconductor device according to claim 13 wherein the first semiconductor layer comprises semi-amorphous silicon.

17. The semiconductor device according to claim 13 wherein the first semiconductor layer comprises polycrystalline silicon.

18. A semiconductor device comprising:
a gate electrode;
a gate insulating film adjacent to the gate electrode;
a first semiconductor layer comprising silicon in contact with the gate insulating film wherein the gate insulating film is interposed between the gate electrode and the first semiconductor layer, the first semiconductor layer including a channel region;
a second semiconductor layer adjacent to the first semiconductor layer wherein the first semiconductor layer is interposed between the gate insulating film and the second semiconductor layer;
a second insulating film in contact with the second semiconductor layer wherein the second semiconductor layer is interposed between the first semiconductor layer and the second insulating film,
wherein the first semiconductor layer has a higher crystallinity than the second semiconductor layer, and the second semiconductor layer comprises amorphous silicon, and
wherein a concentration of oxygen, nitrogen and carbon in the first semiconductor layer is $7\times10^{19}$ cm$^3$ or less.

19. The semiconductor device according to claim 18, wherein the gate electrode is located over the gate insulating film.

20. The semiconductor device according to claim 18 wherein a concentration of oxygen in the second semiconductor layer is higher than that in the first semiconductor layer.

21. The semiconductor device according to claim 18 wherein the first semiconductor layer comprises semi-amorphous silicon.

22. The semiconductor device according to claim 18 wherein the first semiconductor layer comprises polycrystalline silicon.

23. An active matrix display device including a thin film transistor, the thin film transistor comprising:
- a gate electrode;
- a gate insulating film adjacent to the gate electrode;
- a first semiconductor layer comprising silicon in contact with the gate insulating film wherein the gate insulating film is interposed between the gate electrode and the first semiconductor layer, the first semiconductor layer including a channel region;
- a second semiconductor layer adjacent to the first semiconductor layer wherein the first semiconductor layer is interposed between the gate insulating film and the second semiconductor layer;
- a second insulating film in contact with the second semiconductor layer wherein the second semiconductor layer is interposed between the first semiconductor layer and the second insulating film,
- wherein the first semiconductor layer has a higher crystallinity than the second semiconductor layer, and the second semiconductor layer comprises amorphous silicon, and
- wherein a concentration of oxygen, nitrogen and carbon in the first semiconductor layer is $7 \times 10^{19}$ cm$^3$ or less.

24. The active matrix display device according to claim 23 wherein the first semiconductor layer comprises semi-amorphous silicon.

25. The active matrix display device according to claim 23 wherein the first semiconductor layer comprises polycrystalline silicon.

26. The active matrix display device according to claim 23 wherein the active matrix display device is a liquid crystal display device.

* * * * *